(12) United States Patent
Bhakta et al.

US008864500B1

(10) Patent No.: US 8,864,500 B1
(45) Date of Patent: *Oct. 21, 2014

(54) ELECTRONIC MODULE WITH FLEXIBLE PORTION

(71) Applicant: Netlist, Inc., Irvine, CA (US)

(72) Inventors: Jayesh R. Bhakta, Cerritos, CA (US); Enchao Yu, Irvine, CA (US); Chi She Chen, Walnut, CA (US); Richard E. Flaig, Mission Viejo, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/653,254

(22) Filed: Oct. 16, 2012

Related U.S. Application Data

(63) Continuation of application No. 13/231,870, filed on Sep. 13, 2011, now Pat. No. 8,287,291, which is a continuation of application No. 12/874,900, filed on Sep. 2, 2010, now Pat. No. 8,033,836, which is a continuation of application No. 12/237,162, filed on Sep. 24, 2008, now Pat. No. 7,811,097, which is a continuation of application No. 11/511,523, filed on Aug. 28, 2006, now Pat. No. 7,442,050.

(60) Provisional application No. 60/712,156, filed on Aug. 29, 2005.

(51) Int. Cl.
*H01R 12/00* (2006.01)

(52) U.S. Cl.
USPC .......................................... 439/71

(58) Field of Classification Search
USPC ................... 439/70–71; 361/780–785, 803
See application file for complete search history.

(56) References Cited

U.S. PATENT DOCUMENTS

| | | |
|---|---|---|
| 3,268,772 A | 8/1966 | Kamei et al. |
| 3,893,161 A | 7/1975 | Pesak, Jr. |
| 4,535,385 A | 8/1985 | August et al. |
| 4,628,407 A | 12/1986 | August et al. |
| 4,849,858 A | 7/1989 | Grapes et al. |
| 4,867,235 A | 9/1989 | Grapes et al. |
| 4,872,505 A | 10/1989 | Jones et al. |
| 4,887,353 A | 12/1989 | Preputnick |

(Continued)

FOREIGN PATENT DOCUMENTS

| | | |
|---|---|---|
| JP | 2821315 B2 | 11/1998 |
| JP | 2001077294 A | 3/2001 |
| JP | 2003086760 A | 3/2003 |
| JP | 2003086761 A | 3/2003 |

OTHER PUBLICATIONS

Shawn Hall et al., "Low Cost, High Performance Heatsinks for Closely Spaced Dimms," presentation to JEDEC, Dec. 5, 2006.

*Primary Examiner* — Phuong Dinh
(74) *Attorney, Agent, or Firm* — Jamie J. Zheng, Esq.

(57) ABSTRACT

An electronic module for a computer system comprises a first circuit board having a plurality of edge connectors configured to releasably connect to electrical contacts of a computer system socket, a second circuit board having a plurality of contacts configured to connect with a plurality of electrical components, and a flexible portion having electrical conduits to provide electrical connection between the plurality of edge connectors and the plurality of contacts. The flexible portion further includes an electrically conductive layer extending across a region of the flexible portion. The electrically conductive layer is superposed with the electrical conduits and separated from electrical conduits by a dielectric layer.

20 Claims, 25 Drawing Sheets

(56) References Cited

U.S. PATENT DOCUMENTS

| | | | |
|---|---|---|---|
| 5,060,113 | A | 10/1991 | Jacobs |
| 5,109,318 | A | 4/1992 | Funari et al. |
| 5,229,916 | A | 7/1993 | Frankeny et al. |
| 5,244,023 | A | 9/1993 | Spies |
| 5,313,097 | A | 5/1994 | Haj-Ali-Ahmadi et al. |
| 5,343,359 | A | 8/1994 | Morton et al. |
| 5,432,913 | A | 7/1995 | Smits et al. |
| 5,445,869 | A | 8/1995 | Ishikawa et al. |
| 5,513,135 | A | 4/1996 | Dell et al. |
| 5,710,693 | A | 1/1998 | Tsukada et al. |
| 5,731,633 | A | 3/1998 | Clayton |
| 5,739,687 | A | 4/1998 | Hanley |
| 5,751,553 | A | 5/1998 | Clayton |
| 5,754,409 | A | 5/1998 | Smith |
| 5,784,263 | A | 7/1998 | Nelson |
| 5,812,374 | A | 9/1998 | Shuff |
| 5,892,658 | A | 4/1999 | Urda et al. |
| 5,896,274 | A | 4/1999 | Ishida |
| 5,901,781 | A | 5/1999 | Arai et al. |
| 5,949,650 | A | 9/1999 | Bulante et al. |
| 5,949,657 | A | 9/1999 | Karabatsos |
| 5,966,287 | A | 10/1999 | Lofland et al. |
| 5,986,887 | A | 11/1999 | Smith et al. |
| 6,021,048 | A | 2/2000 | Smith |
| 6,025,992 | A | 2/2000 | Dodge et al. |
| 6,049,975 | A | 4/2000 | Clayton |
| 6,064,575 | A | 5/2000 | Urda et al. |
| 6,091,145 | A | 7/2000 | Clayton |
| 6,104,613 | A | 8/2000 | Urda et al. |
| 6,119,765 | A | 9/2000 | Lee |
| 6,151,215 | A | 11/2000 | Hoffman |
| 6,157,541 | A | 12/2000 | Hacke et al. |
| 6,173,382 | B1 | 1/2001 | Dell et al. |
| 6,180,881 | B1 | 1/2001 | Isaak |
| 6,201,700 | B1 | 3/2001 | Tzinares et al. |
| 6,208,517 | B1 | 3/2001 | Prince et al. |
| 6,222,739 | B1 | 4/2001 | Bhakta et al. |
| 6,232,659 | B1 | 5/2001 | Clayton |
| 6,233,150 | B1 | 5/2001 | Lin et al. |
| 6,297,960 | B1 | 10/2001 | Moden et al. |
| 6,377,460 | B1 | 4/2002 | Pohl et al. |
| 6,381,140 | B1 | 4/2002 | Liao |
| 6,392,305 | B1 | 5/2002 | Huang et al. |
| 6,423,909 | B1 * | 7/2002 | Haynie et al. ............ 174/261 |
| 6,424,532 | B2 | 7/2002 | Kawamura et al. |
| 6,444,921 | B1 | 9/2002 | Wang et al. |
| 6,449,159 | B1 | 9/2002 | Haba |
| 6,507,912 | B1 | 1/2003 | Matyas, Jr. et al. |
| 6,510,100 | B2 | 1/2003 | Grundon et al. |
| 6,525,943 | B2 | 2/2003 | Moden et al. |
| 6,535,387 | B2 | 3/2003 | Summers et al. |
| 6,576,992 | B1 | 6/2003 | Cady et al. |
| 6,590,282 | B1 | 7/2003 | Wang et al. |
| 6,713,854 | B1 | 3/2004 | Kledzik et al. |
| 6,740,821 | B1 * | 5/2004 | Jiang et al. ............ 174/260 |
| 6,757,751 | B1 | 6/2004 | Gene |
| 6,760,224 | B2 | 7/2004 | Moden et al. |
| 6,762,942 | B1 | 7/2004 | Smith |
| 6,765,797 | B2 | 7/2004 | Summers et al. |
| 6,833,984 | B1 | 12/2004 | Belgacem |
| 6,956,284 | B2 | 10/2005 | Cady et al. |
| 7,023,700 | B2 | 4/2006 | Chiou et al. |
| 7,023,701 | B2 | 4/2006 | Stocken et al. |
| 7,053,478 | B2 | 5/2006 | Roper et al. |
| 7,079,396 | B2 | 7/2006 | Gates et al. |
| 7,094,632 | B2 | 8/2006 | Cady et al. |
| 7,106,595 | B2 | 9/2006 | Foster, Sr. et al. |
| 7,181,167 | B2 | 2/2007 | Onggosanusi et al. |
| 7,215,551 | B2 | 5/2007 | Wang et al. |
| 7,254,036 | B2 | 8/2007 | Pauley et al. |
| 7,289,327 | B2 | 10/2007 | Goodwin et al. |
| 7,304,842 | B2 | 12/2007 | Yatskov |
| 7,324,352 | B2 | 1/2008 | Goodwin |
| 7,345,882 | B2 | 3/2008 | Lee et al. |
| 7,349,219 | B2 | 3/2008 | Lai et al. |
| 7,349,220 | B2 | 3/2008 | Lai et al. |
| 7,375,970 | B2 | 5/2008 | Pauley et al. |
| 7,382,617 | B2 | 6/2008 | Yu et al. |
| 7,442,050 | B1 | 10/2008 | Bhakta et al. |
| 7,443,023 | B2 | 10/2008 | Wehrly, Jr. et al. |
| 7,457,122 | B2 | 11/2008 | Lai et al. |
| 7,474,529 | B2 | 1/2009 | Tian et al. |
| 7,609,523 | B1 | 10/2009 | Ni et al. |
| 7,619,893 | B1 | 11/2009 | Yu |
| 7,630,202 | B2 | 12/2009 | Pauley et al. |
| 7,755,897 | B2 | 7/2010 | Chen et al. |
| 7,768,785 | B2 | 8/2010 | Ni et al. |
| 7,811,097 | B1 * | 10/2010 | Bhakta et al. ............ 439/71 |
| 2002/0076959 | A1 | 6/2002 | Lee |
| 2002/0125039 | A1 | 9/2002 | Marketkar et al. |
| 2003/0026076 | A1 | 2/2003 | Wei |
| 2003/0116835 | A1 | 6/2003 | Miyamoto et al. |
| 2003/0234443 | A1 | 12/2003 | Partridge et al. |
| 2004/0229402 | A1 | 11/2004 | Cady et al. |
| 2004/0236877 | A1 | 11/2004 | Burton |
| 2004/0262737 | A1 | 12/2004 | Haba |
| 2005/0018412 | A1 | 1/2005 | Roper et al. |
| 2005/0047776 | A1 | 3/2005 | Watanabe et al. |
| 2005/0057911 | A1 | 3/2005 | Rapport et al. |
| 2005/0146031 | A1 | 7/2005 | Partridge et al. |
| 2005/0242423 | A1 | 11/2005 | Partridge et al. |
| 2005/0259504 | A1 | 11/2005 | Knaack et al. |
| 2005/0263911 | A1 | 12/2005 | Igarashi et al. |
| 2005/0289287 | A1 | 12/2005 | Han et al. |
| 2006/0020740 | A1 | 1/2006 | Bartley et al. |
| 2006/0048385 | A1 | 3/2006 | Cady et al. |
| 2006/0049500 | A1 | 3/2006 | Goodwin |
| 2006/0049502 | A1 | 3/2006 | Goodwin et al. |
| 2006/0049512 | A1 | 3/2006 | Goodwin |
| 2006/0049513 | A1 | 3/2006 | Goodwin |
| 2006/0050488 | A1 | 3/2006 | Goodwin |
| 2006/0050489 | A1 | 3/2006 | Wehrly, Jr. et al. |
| 2006/0050492 | A1 | 3/2006 | Goodwin et al. |
| 2006/0050496 | A1 | 3/2006 | Goodwin |
| 2006/0050497 | A1 | 3/2006 | Goodwin |
| 2006/0050498 | A1 | 3/2006 | Cady et al. |
| 2006/0050592 | A1 | 3/2006 | Cady et al. |
| 2006/0053345 | A1 | 3/2006 | Goodwin |
| 2006/0083043 | A1 | 4/2006 | Cypher et al. |
| 2006/0090102 | A1 | 4/2006 | Wehrly et al. |
| 2006/0090119 | A1 | 4/2006 | Dong et al. |
| 2006/0091529 | A1 | 5/2006 | Wehrly, Jr. et al. |
| 2006/0095592 | A1 | 5/2006 | Borkenhagen et al. |
| 2006/0111866 | A1 | 5/2006 | Leclerg et al. |
| 2006/0125067 | A1 | 6/2006 | Wehrly, Jr. et al. |
| 2006/0129888 | A1 | 6/2006 | Szewerenko et al. |
| 2006/0198238 | A1 | 9/2006 | Partridge et al. |
| 2006/0203442 | A1 | 9/2006 | Goodwin |
| 2006/0250780 | A1 | 11/2006 | Goodwin |
| 2006/0261449 | A1 | 11/2006 | Rapport et al. |
| 2007/0111606 | A1 | 5/2007 | Goodwin |
| 2007/0115017 | A1 | 5/2007 | Goodwin et al. |
| 2007/0126124 | A1 | 6/2007 | Rapport et al. |
| 2007/0126125 | A1 | 6/2007 | Rapport et al. |
| 2007/0201208 | A1 | 8/2007 | Goodwin et al. |

\* cited by examiner

FIG. 8A

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| 1 | VREF | 1 | DQ0 | DQ4 | 1 | VSS | 93 |
| 2 | DQ0 | 2 | DQ1 | DQ5 | 2 | DQ4 | 94 |
| 3 | VSS | 3 | DQS0 | DM0/DQS9 | 3 | DQ5 | 95 |
| 4 | DQ1 | 4 | DQ2 | DQ6 | 4 | VDDQ | 96 |
| 5 | DQS0 | 5 | DQ3 | DQ7 | 5 | DM0/DQS9 | 97 |
| 6 | DQ2 | 6 | VDD | VDD | 6 | DQ6 | 98 |
| 7 | VDD | 7 | CLK6 | CLK5 | 7 | DQ7 | 99 |
| 8 | DQ3 | 8 | CLK6# | CLK5# | 8 | VSS | 100 |
| 9 | NC | 9 | VSS | VSS | 9 | NC | 101 |
| 10 | RESET# | 10 | DQ8 | DQ12 | 10 | NC | 102 |
| 11 | VSS | 11 | DQ9 | DQ13 | 11 | NC | 103 |
| 12 | DQ8 | 12 | DQS1 | DM1/DQS10 | 12 | VDDQ | 104 |
| 13 | DQ9 | 13 | DQ10 | DQ14 | 13 | DQ12 | 105 |
| 14 | DQS1 | 14 | DQ11 | DQ15 | 14 | DQ13 | 106 |
| 15 | VDDQ | 15 | VDD | VDD | 15 | DM1/DQS10 | 107 |
| 16 | *CK1 | 16 | CAS-A | CAS-A | 16 | VDD | 108 |
| 17 | *CK1# | 17 | CS2-A | CS2-A | 17 | DQ14 | 109 |
| 18 | VSS | 18 | WE-A | WE-A | 18 | DQ15 | 110 |
| 19 | DQ10 | 19 | CS3-A | CS3-A | 19 | CKE1 | 111 |
| 20 | DQ11 | 20 | BA0-A | BA0-A | 20 | VDDQ | 112 |
| 21 | CKE0 | 21 | CS1-A | CS1-A | 21 | NC | 113 |
| 22 | VDDQ | 22 | VSS | VSS | 22 | DQ20 | 114 |
| 23 | DQ16 | 23 | BA1-A | BA1-A | 23 | A12 | 115 |
| 24 | DQ17 | 24 | CS0-A | CS0-A | 24 | VSS | 116 |
| 25 | DQS2 | 25 | A0-A | A0-A | 25 | DQ21 | 117 |
| 26 | VSS | 26 | RAS-A | RAS-A | 26 | A11 | 118 |
| 27 | A9 | 27 | A1-A | A1-A | 27 | DM2/DQS11 | 119 |
| 28 | DQ18 | 28 | A10-A | A10-A | 28 | VDD | 120 |
| 29 | A7 | 29 | VDD | VDD | 29 | DQ22 | 121 |
| 30 | VDDQ | 30 | A2-A | A2-A | 30 | A8 | 122 |
| 31 | DQ19 | 31 | A3-A | A3-A | 31 | DQ23 | 123 |
| 32 | A5 | 32 | A4-A | A4-A | 32 | VSS | 124 |
| 33 | DQ24 | 33 | A6-A | A6-A | 33 | A6 | 125 |
| 34 | VSS | 34 | A5-A | A5-A | 34 | DQ28 | 126 |
| 35 | DQ25 | 35 | A8-A | A8-A | 35 | DQ29 | 127 |
| 36 | DQS3 | 36 | VSS | VSS | 36 | VDDQ | 128 |
| 37 | A4 | 37 | A7-A | A7-A | 37 | DM3/DQS12 | 129 |
| 38 | VDD | 38 | A11-A | A11-A | 38 | A3 | 130 |
| 39 | DQ26 | 39 | A9-A | A9-A | 39 | DQ30 | 131 |
| 40 | DQ27 | 40 | A12-A | A12-A | 40 | VSS | 132 |
| 41 | A2 | 41 | CKE0-A | CKE0-A | 41 | SQ31 | 133 |
| 42 | VSS | 42 | CKE1-A | CKE1-A | 42 | CB4 | 134 |
| 43 | A1 | 43 | VDD | VDD | 43 | CB5 | 135 |
| 44 | CB0 | 44 | DQ16 | DQ20 | 44 | VDDQ | 136 |
| 45 | CB1 | 45 | DQ17 | DQ21 | 45 | CK0 | 137 |
| 46 | VDD | 46 | DQS2 | DM2/DQS11 | 46 | CK0# | 138 |
| 47 | DQS8 | 47 | DQ18 | DQ22 | 47 | VSS | 139 |

FIG. 8B

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| 48 | A0 | 48 | DQ19 | DQ23 | 48 | DM8/DQS17 | 140 |
| 49 | CB2 | 49 | VSS | VSS | 49 | A10 | 141 |
| 50 | VSS | 50 | CLK0 | CLK1 | 50 | CB6 | 142 |
| 51 | CB3 | 51 | CLK0# | CLK1# | 51 | VDDQ | 143 |
| 52 | BA1 | 52 | VDD | VDD | 52 | CB7 | 144 |
|    | KEY | 53 | DQ24 | DQ28 | 53 | KEY |    |
| 53 | DQ32 | 54 | DQ25 | DQ29 | 54 | VSS | 145 |
| 54 | VDDQ | 55 | DQS3 | DM3/DQS12 | 55 | DQ36 | 146 |
| 55 | DQ33 | 56 | DQ26 | DQ30 | 56 | DQ37 | 147 |
| 56 | DQS4 | 57 | DQ27 | DQ31 | 57 | VDD | 148 |
| 57 | DQ34 | 58 | VSS | VSS | 58 | DM4/DQS13 | 149 |
| 58 | VSS | 59 | CB0 | CB4 | 59 | DQ38 | 150 |
| 59 | BA0 | 60 | CB1 | CB5 | 60 | DQ39 | 151 |
| 60 | DQ35 | 61 | VDD | DM8/DQS17 | 61 | VSS | 152 |
| 61 | DQ40 | 62 | CLK2 | VREF | 62 | DQ44 | 153 |
| 62 | VDDQ | 63 | CLK2# | CLK2# | 63 | RAS# | 154 |
| 63 | WE# | 64 | VREF | CLK2 | 64 | DQ45 | 155 |
| 64 | DQ41 | 65 | DQS8 | VDD | 65 | VDDQ | 156 |
| 65 | CAS# | 66 | CB2 | CB6 | 66 | S0# | 157 |
| 66 | VSS | 67 | CB3 | CB7 | 67 | S1# | 158 |
| 67 | DQS5 | 68 | VSS | VSS | 68 | DM5/DQS14 | 159 |
| 68 | DQ42 | 69 | DQ32 | DQ36 | 69 | VSS | 160 |
| 69 | DQ43 | 70 | DQ33 | DQ37 | 70 | DQ46 | 161 |
| 70 | VDD | 71 | DQS4 | DM4/DQS13 | 71 | DQ47 | 162 |
| 71 | S2# | 72 | DQ34 | DQ38 | 72 | S3# | 163 |
| 72 | DQ48 | 73 | DQ35 | DQ39 | 73 | VDDQ | 164 |
| 73 | DQ49 | 74 | VDD | VDD | 74 | DQ52 | 165 |
| 74 | VSS | 75 | CLK3# | CLK4# | 75 | DQ53 | 166 |
| 75 | *CK2# | 76 | CLK3 | CLK4 | 76 | *A13 | 167 |
| 76 | *CK2 | 77 | VSS | VSS | 77 | VDD | 168 |
| 77 | VDDQ | 78 | DQ40 | DQ44 | 78 | DM6/DQS15 | 169 |
| 78 | DQS6 | 79 | DQ41 | DQ45 | 79 | DQ54 | 170 |
| 79 | DQ50 | 80 | DQS5 | DM5/DQS14 | 80 | DQ55 | 171 |
| 80 | DQ51 | 81 | DQ42 | DQ46 | 81 | VDDQ | 172 |
| 81 | VSS | 82 | DQ43 | DQ47 | 82 | NC | 173 |
| 82 | VDDID | 83 | VDD | VDD | 83 | DQ60 | 174 |
| 83 | DQ56 | 84 | CKE1-B | CKE1-B | 84 | DQ61 | 175 |
| 84 | DQ57 | 85 | CKE0-B | CKE0-B | 85 | VSS | 176 |
| 85 | VDD | 86 | A12-B | A12-B | 86 | DM7/DQS16 | 177 |
| 86 | DQS7 | 87 | A9-B | A9-B | 87 | DQ62 | 178 |
| 87 | DQ58 | 88 | A11-B | A11-B | 88 | DQ63 | 179 |
| 88 | DQ59 | 89 | A7-B | A7-B | 89 | VDDQ | 180 |
| 89 | VSS | 90 | VSS | VSS | 90 | SA0 | 181 |
| 90 | NC | 91 | A8-B | A8-B | 91 | SA1 | 182 |
| 91 | SDA | 92 | A5-B | A5-B | 92 | SA2 | 183 |
| 92 | SCL | 93 | A6-B | A6-B | 93 | VDDSPD | 184 |

FIG. 8C

| Edge connector contacts 112 on first side 114 of substrate 110 | Contacts 120 on first side 114 of substrate 110 | | Contacts 120 on second side 116 of substrate 110 | | Edge connector contacts 112 on second side 116 of substrate 110 |
|---|---|---|---|---|---|
| | 94 | A4-B | A4-B | 94 | |
| | 95 | A3-B | A3-B | 95 | |
| | 96 | A2-B | A2-B | 96 | |
| | 97 | VDD | VDD | 97 | |
| | 98 | A10-B | A10-B | 98 | |
| | 99 | A1-B | A1-B | 99 | |
| | 100 | RAS-B | RAS-B | 100 | |
| | 101 | A0-B | A0-B | 101 | |
| | 102 | CS0-B | CS0-B | 102 | |
| | 103 | BA1-B | BA1-B | 103 | |
| | 104 | VSS | VSS | 104 | |
| | 105 | CS1-B | CS1-B | 105 | |
| | 106 | BA0-B | BA0-B | 106 | |
| | 107 | CS3-B | CS3-B | 107 | |
| | 108 | WE-B | WE-B | 108 | |
| | 109 | CS2-B | CS2-B | 109 | |
| | 110 | CAS-B | CAS-B | 110 | |
| | 111 | VDD | VDD | 111 | |
| | 112 | DQ48 | DQ52 | 112 | |
| | 113 | DQ49 | DQ53 | 113 | |
| | 114 | DQS6 | DM6/DQS15 | 114 | |
| | 115 | DQ50 | DQ54 | 115 | |
| | 116 | DQ51 | DQ55 | 116 | |
| | 117 | VSS | VSS | 117 | |
| | 118 | CLK9# | CLK8# | 118 | |
| | 119 | CLK9 | CLK8 | 119 | |
| | 120 | VDD | VDD | 120 | |
| | 121 | DQ56 | DQ60 | 121 | |
| | 122 | DQ57 | DQ61 | 122 | |
| | 123 | DQS7 | DM7/DQS16 | 123 | |
| | 124 | DQ58 | DQ62 | 124 | |
| | 125 | DQ59 | DQ63 | 125 | |

FIG. 9A

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| 1 | VREF | 1 | VREF | VREF | 1 | VSS | 121 |
| 2 | VSS | 2 | VSS | VSS | 2 | DQ4 | 122 |
| 3 | DQ0 | 3 | DQ0 | DQ4 | 3 | DQ5 | 123 |
| 4 | DQ1 | 4 | DQ1 | DQ5 | 4 | VSS | 124 |
| 5 | VSS | 5 | DQS0# | DQS9# | 5 | DM0/DQS9 | 125 |
| 6 | DQS0# | 6 | VSS | VSS | 6 | DQS9# | 126 |
| 7 | DQS0 | 7 | DQS0 | DQS9 | 7 | VSS | 127 |
| 8 | VSS | 8 | DQ2 | DQ6 | 8 | DQ6 | 128 |
| 9 | DQ2 | 9 | DQ3 | DQ7 | 9 | DQ7 | 129 |
| 10 | DQ3 | 10 | VSS | VSS | 10 | VSS | 130 |
| 11 | VSS | 11 | DQ8 | DQ12 | 11 | DQ12 | 131 |
| 12 | DQ8 | 12 | DQ9 | DQ13 | 12 | DQ13 | 132 |
| 13 | DQ9 | 13 | DQS1# | DQS10# | 13 | VSS | 133 |
| 14 | VSS | 14 | VSS | VSS | 14 | DM1/DQS10 | 134 |
| 15 | DQS1# | 15 | DQS1 | DQS10 | 15 | DQS10# | 135 |
| 16 | DQS1 | 16 | DQ10 | DQ14 | 16 | VSS | 136 |
| 17 | VSS | 17 | DQ11 | DQ15 | 17 | CK1/NC | 137 |
| 18 | RESET# | 18 | VSS | VSS | 18 | CK1#/NC | 138 |
| 19 | NC | 19 | DQ16 | DQ20 | 19 | VSS | 139 |
| 20 | VSS | 20 | DQ17 | DQ21 | 20 | DQ14 | 140 |
| 21 | DQ10 | 21 | DQS2# | DQS11# | 21 | DQ15 | 141 |
| 22 | DQ11 | 22 | VSS | VSS | 22 | VSS | 142 |
| 23 | VSS | 23 | DQS2 | DQS11 | 23 | DQ20 | 143 |
| 24 | DQ16 | 24 | DQ18 | DQ22 | 24 | DQ21 | 144 |
| 25 | DQ17 | 25 | DQ19 | DQ23 | 25 | VSS | 145 |
| 26 | VSS | 26 | VSS | VSS | 26 | DM2/DQS11 | 146 |
| 27 | DQS2# | 27 | DQ24 | DQ28 | 27 | DQS11# | 147 |
| 28 | DQS2 | 28 | DQ25 | DQ29 | 28 | VSS | 148 |
| 29 | VSS | 29 | DQS3# | DQS12# | 29 | DQ22 | 149 |
| 30 | DQ18 | 30 | VSS | VSS | 30 | DQ23 | 150 |
| 31 | DQ19 | 31 | DQS3 | DQS12 | 31 | VSS | 151 |
| 32 | VSS | 32 | DQ26 | DQ30 | 32 | DQ28 | 152 |
| 33 | DQ24 | 33 | DQ27 | DQ31 | 33 | DQ29 | 153 |
| 34 | DQ25 | 34 | VSS | VSS | 34 | VSS | 154 |
| 35 | VSS | 35 | CB0 | CB4 | 35 | DM3/DQS12 | 155 |
| 36 | DQS3# | 36 | CB1 | CB5 | 36 | DQS12# | 156 |
| 37 | DQS3 | 37 | DQS8# | DQS17# | 37 | VSS | 157 |
| 38 | VSS | 38 | VSS | VSS | 38 | DQ30 | 158 |
| 39 | DQ26 | 39 | DQS8 | DQS17 | 39 | DQ31 | 159 |
| 40 | DQ27 | 40 | CB2 | CB6 | 40 | VSS | 160 |
| 41 | VSS | 41 | CB3 | CB7 | 41 | CB4 | 161 |
| 42 | CB0 | 42 | VSS | VSS | 42 | CB5 | 162 |
| 43 | CB1 | 43 | RESET# | RESET# | 43 | VSS | 163 |
| 44 | VSS | 44 | VDD | VDD | 44 | DM8/DQS17 | 164 |
| 45 | DQS8# | 45 | CKE0 | CKE0 | 45 | DQS17# | 165 |
| 46 | DQS8 | 46 | CKE1 | CKE1 | 46 | VSS | 166 |

FIG. 9B

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| 47 | VSS | 47 | BA2 | BA2 | 47 | CB6 | 167 |
| 48 | CB2 | 48 | A15 | A15 | 48 | CB7 | 168 |
| 49 | CB3 | 49 | VDDQ | VDDQ | 49 | VSS | 169 |
| 50 | VSS | 50 | PAR-OUT | PAR-OUT | 50 | VDDQ | 170 |
| 51 | VDDQ | 51 | A14 | A14 | 51 | CKE1 | 171 |
| 52 | CKE0 | 52 | A11 | A11 | 52 | VDD | 172 |
| 53 | VDD | 53 | A12 | A12 | 53 | A15 | 173 |
| 54 | BA2 | 54 | VDD | VDD | 54 | A14 | 174 |
| 55 | PAR-OUT | 55 | A7 | A7 | 55 | VDDQ | 175 |
| 56 | VDDQ | 56 | A9 | A9 | 56 | A12 | 176 |
| 57 | A11 | 57 | A5 | A5 | 57 | A9 | 177 |
| 58 | A7 | 58 | A8 | A8 | 58 | VDD | 178 |
| 59 | VDD | 59 | VDDQ | VDDQ | 59 | A8 | 179 |
| 60 | A5 | 60 | A4 | A4 | 60 | A6 | 180 |
| 61 | A4 | 61 | A6 | A6 | 61 | VDDQ | 181 |
| 62 | VDDQ | 62 | A2 | A2 | 62 | A3 | 182 |
| 63 | A2 | 63 | A3 | A3 | 63 | A1 | 183 |
| 64 | VDD | 64 | VDD | VDD | 64 | VDD | 184 |
| 65 | VSS | 65 | CK0 | CK0 | 65 | CK0 | 185 |
| 66 | VSS | 66 | CK0# | CK0# | 66 | CK0# | 186 |
| 67 | VDD | 67 | VDD | VDD | 67 | VDD | 187 |
| 68 | PAR-IN | 68 | PAR-IN | PAR-IN | 68 | A0 | 188 |
| 69 | VDD | 69 | A1 | A1 | 69 | VDD | 189 |
| 70 | A10/AP | 70 | A10/AP | A10/AP | 70 | BA1 | 190 |
| 71 | BA0 | 71 | A0 | A0 | 71 | VDDQ | 191 |
| 72 | VDDQ | 72 | VDDQ | VDDQ | 72 | RAS# | 192 |
| 73 | WE# | 73 | BA0 | BA0 | 73 | S0# | 193 |
| 74 | CAS# | 74 | BA1 | BA1 | 74 | VDDQ | 194 |
| 75 | VDDQ | 75 | WE# | WE# | 75 | ODT0 | 195 |
| 76 | S1# | 76 | RAS# | RAS# | 76 | A13 | 196 |
| 77 | ODT1 | 77 | VDD | VDD | 77 | VDD | 197 |
| 78 | VDDQ | 78 | CAS# | CAS# | 78 | VSS | 198 |
| 79 | VSS | 79 | S0# | S0# | 79 | DQ36 | 199 |
| 80 | DQ32 | 80 | S1# | S1# | 80 | DQ37 | 200 |
| 81 | DQ33 | 81 | ODT0 | ODT0 | 81 | VSS | 201 |
| 82 | VSS | 82 | VDDQ | VDDQ | 82 | DM4/DQS13 | 202 |
| 83 | DQS4# | 83 | ODT1 | ODT1 | 83 | DQS13# | 203 |
| 84 | DQS4 | 84 | A13 | A13 | 84 | VSS | 204 |
| 85 | VSS | 85 | S2# | S2# | 85 | DQ38 | 205 |
| 86 | DQ34 | 86 | S3# | S3# | 86 | DQ39 | 206 |
| 87 | DQ35 | 87 | VDD | VDD | 87 | VSS | 207 |
| 88 | VSS | 88 | VSS | VSS | 88 | DQ44 | 208 |
| 89 | DQ40 | 89 | DQ32 | DQ36 | 89 | DQ45 | 209 |
| 90 | DQ41 | 90 | DQ33 | DQ37 | 90 | VSS | 210 |
| 91 | VSS | 91 | DQS4# | DQS13# | 91 | DM5/DQS14 | 211 |
| 92 | DQS5# | 92 | VSS | VSS | 92 | DQS14# | 212 |

FIG. 9C

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| 93 | DQS5 | 93 | DQS4 | DQS13 | 93 | VSS | 213 |
| 94 | VSS | 94 | DQ34 | DQ38 | 94 | DQ46 | 214 |
| 95 | DQ42 | 95 | DQ35 | DQ39 | 95 | DQ47 | 215 |
| 96 | DQ43 | 96 | VSS | VSS | 96 | VSS | 216 |
| 97 | VSS | 97 | DQ40 | DQ44 | 97 | DQ52 | 217 |
| 98 | DQ48 | 98 | DQ41 | DQ45 | 98 | DQ53 | 218 |
| 99 | DQ49 | 99 | DQS5# | DQS14# | 99 | VSS | 219 |
| 100 | VSS | 100 | VSS | VSS | 100 | CLK2/S2# | 220 |
| 101 | SA2 | 101 | DQS5 | DQS14 | 101 | CLK2#/S3# | 221 |
| 102 | Test | 102 | DQ42 | DQ46 | 102 | VSS | 222 |
| 103 | VSS | 103 | DQ43 | DQ47 | 103 | DM6/DQS15 | 223 |
| 104 | DQS6# | 104 | VSS | VSS | 104 | DQS15# | 224 |
| 105 | DQS6 | 105 | DQ48 | DQ52 | 105 | VSS | 225 |
| 106 | VSS | 106 | DQ49 | DQ53 | 106 | DQ54 | 226 |
| 107 | DQ50 | 107 | DQS6# | DQS15# | 107 | DQ55 | 227 |
| 108 | DQ51 | 108 | VSS | VSS | 108 | VSS | 228 |
| 109 | VSS | 109 | DQS6 | DQS15 | 109 | DQ60 | 229 |
| 110 | DQ56 | 110 | DQ50 | DQ54 | 110 | DQ61 | 230 |
| 111 | DQ57 | 111 | DQ51 | DQ55 | 111 | VSS | 231 |
| 112 | VSS | 112 | VSS | VSS | 112 | DM7/DQS16 | 232 |
| 113 | DQS7# | 113 | DQ56 | DQ60 | 113 | DQS16# | 233 |
| 114 | DQS7 | 114 | DQ57 | DQ61 | 114 | VSS | 234 |
| 115 | VSS | 115 | DQS7# | DQS16# | 115 | DQ62 | 235 |
| 116 | DQ58 | 116 | VSS | VSS | 116 | DQ63 | 236 |
| 117 | DQ59 | 117 | DQS7 | DQS16 | 117 | VSS | 237 |
| 118 | VSS | 118 | DQ58 | DQ62 | 118 | VDDSPD | 238 |
| 119 | SDA | 119 | DQ59 | DQ63 | 119 | SA0 | 239 |
| 120 | SCL | 120 | VSS | VSS | 120 | SA1 | 240 |

FIG. 10A

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| | | 1 | VSS | VSS | 1 | | |
| | | 2 | DQ0 | DQ4 | 2 | | |
| | | 3 | DQ1 | DQ5 | 3 | | |
| | | 4 | DQS0# | DQS9 | 4 | | |
| | | 5 | DQS0 | DQS9# | 5 | | |
| | | 6 | DQ2 | DQ6 | 6 | | |
| | | 7 | DQ3 | DQ7 | 7 | | |
| | | 8 | VSS | VSS | 8 | | |
| | | 9 | CK0# | CK1 | 9 | | |
| | | 10 | CK0 | CK1# | 10 | | |
| | | 11 | VSS | VSS | 11 | | |
| | | 12 | DQ8 | DQ12 | 12 | | |
| | | 13 | DQ9 | DQ13 | 13 | | |
| | | 14 | DQS1# | DQS10 | 14 | | |
| | | 15 | DQS1 | DQS10# | 15 | | |
| | | 16 | DQ10 | DQ14 | 16 | | |
| | | 17 | DQ11 | DQ15 | 17 | | |
| 1 | VREF | 18 | VSS | VSS | 18 | VSS | 121 |
| 2 | VSS | 19 | VDDQ | VDDQ | 19 | DQ4 | 122 |
| 3 | DQ0 | 20 | CKE0 | CKE0 | 20 | DQ5 | 123 |
| 4 | DQ1 | 21 | CKE1 | CKE1 | 21 | VSS | 124 |
| 5 | VSS | 22 | BA2 | BA2 | 22 | DM0/DQS9 | 125 |
| 6 | DQS0# | 23 | S3# | S3# | 23 | DQS9# | 126 |
| 7 | DQS0 | 24 | VDDQ | VDDQ | 24 | VSS | 127 |
| 8 | VSS | 25 | S2# | S2# | 25 | DQ6 | 128 |
| 9 | DQ2 | 26 | A11 | A11 | 26 | DQ7 | 129 |
| 10 | DQ3 | 27 | A7 | A7 | 27 | VSS | 130 |
| 11 | VSS | 28 | A12 | A12 | 28 | DQ12 | 131 |
| 12 | DQ8 | 29 | VDDQ | VDDQ | 29 | DQ13 | 132 |
| 13 | DQ9 | 30 | A9 | A9 | 30 | VSS | 133 |
| 14 | VSS | 31 | A5 | A5 | 31 | DM1/DQS10 | 134 |
| 15 | DQS1# | 32 | A4 | A4 | 32 | DQS10# | 135 |
| 16 | DQS1 | 33 | A8 | A8 | 33 | VSS | 136 |
| 17 | VSS | 34 | VDDQ | VDDQ | 34 | CK1/NC | 137 |
| 18 | RESET# | 35 | A6 | A6 | 35 | CK1#/NC | 138 |
| 19 | NC | 36 | A2 | A2 | 36 | VSS | 139 |
| 20 | VSS | 37 | A3 | A3 | 37 | DQ14 | 140 |
| 21 | DQ10 | 38 | A1 | A1 | 38 | DQ15 | 141 |
| 22 | DQ11 | 39 | VDDQ | VDDQ | 39 | VSS | 142 |
| 23 | VSS | 40 | A0 | A0 | 40 | DQ20 | 143 |
| 24 | DQ16 | 41 | A10/AP | A10/AP | 41 | DQ21 | 144 |
| 25 | DQ17 | 42 | BA0 | BA0 | 42 | VSS | 145 |
| 26 | VSS | 43 | BA1 | BA1 | 43 | DM2/DQS11 | 146 |
| 27 | DQS2# | 44 | VDDQ | VDDQ | 44 | DQS11# | 147 |
| 28 | DQS2 | 45 | WE# | WE# | 45 | VSS | 148 |
| 29 | VSS | 46 | CAS# | CAS# | 46 | DQ22 | 149 |
| 30 | DQ18 | 47 | RAS# | RAS# | 47 | DQ23 | 150 |
| 31 | DQ19 | 48 | S0# | S0# | 48 | VSS | 151 |
| 32 | VSS | 49 | VDDQ | VDDQ | 49 | DQ28 | 152 |
| 33 | DQ24 | 50 | S1# | S1# | 50 | DQ29 | 153 |
| 34 | DQ25 | 51 | ODT0 | ODT0 | 51 | VSS | 154 |
| 35 | VSS | 52 | ODT1 | ODT1 | 52 | DM3/DQS12 | 155 |
| 36 | DQS3# | 53 | A13 | A13 | 53 | DQS12# | 156 |

FIG. 10B

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| 37 | DQS3 | 54 | VDDQ | VDDQ | 54 | VSS | 157 |
| 38 | VSS | 55 | VSS | VSS | 55 | DQ30 | 158 |
| 39 | DQ26 | 56 | DQ16 | DQ20 | 56 | DQ31 | 159 |
| 40 | DQ27 | 57 | DQ17 | DQ21 | 57 | VSS | 160 |
| 41 | VSS | 58 | DQS2# | DQS11 | 58 | CB4 | 161 |
| 42 | CB0 | 59 | DQS2 | DQS11# | 59 | CB5 | 162 |
| 43 | CB1 | 60 | DQ18 | DQ22 | 60 | VSS | 163 |
| 44 | VSS | 61 | DQ19 | DQ23 | 61 | DM8/DQS17 | 164 |
| 45 | DQS8# | 62 | VSS | VSS | 62 | DQS17# | 165 |
| 46 | DQS8 | 63 | CK2# | CK3 | 63 | VSS | 166 |
| 47 | VSS | 64 | CK2 | CK3# | 64 | CB6 | 167 |
| 48 | CB2 | 65 | VSS | VSS | 65 | CB7 | 168 |
| 49 | CB3 | 66 | DQ24 | DQ28 | 66 | VSS | 169 |
| 50 | VSS | 67 | DQ25 | DQ29 | 67 | VDDQ | 170 |
| 51 | VDDQ | 68 | DQS3# | DQS12 | 68 | CKE1 | 171 |
| 52 | CKE0 | 69 | DQS3 | DQS12# | 69 | VDD | 172 |
| 53 | VDD | 70 | DQ26 | DQ30 | 70 | A15 | 173 |
| 54 | BA2 | 71 | DQ27 | DQ31 | 71 | A14 | 174 |
| 55 | PAR-OUT | 72 | VSS | VSS | 72 | VDDQ | 175 |
| 56 | VDDQ | 73 | CB0 | CB4 | 73 | A12 | 176 |
| 57 | A11 | 74 | CB1 | CB5 | 74 | A9 | 177 |
| 58 | A7 | 75 | DQS8# | VSS | 75 | VDD | 178 |
| 59 | VDD | 76 | DQS8 | CK8 | 76 | A8 | 179 |
| 60 | A5 | 77 | VREF | CK8# | 77 | A6 | 180 |
| 61 | A4 | 78 | CK8# | VREF | 78 | VDDQ | 181 |
| 62 | VDDQ | 79 | CK8 | DQS17 | 79 | A3 | 182 |
| 63 | A2 | 80 | VSS | DQS17# | 80 | A1 | 183 |
| 64 | VDD | 81 | CB2 | CB6 | 81 | VDD | 184 |
| 65 | VSS | 82 | CB3 | CB7 | 82 | CK0 | 185 |
| 66 | VSS | 83 | VSS | VSS | 83 | CK0# | 186 |
| 67 | VDD | 84 | DQ32 | DQ36 | 84 | VDD | 187 |
| 68 | PAR-IN | 85 | DQ33 | DQ37 | 85 | A0 | 188 |
| 69 | VDD | 86 | DQS4# | DQS13 | 86 | VDD | 189 |
| 70 | A10/AP | 87 | DQS4 | DQS13# | 87 | BA1 | 190 |
| 71 | BA0 | 88 | DQ34 | DQ38 | 88 | VDDQ | 191 |
| 72 | VDDQ | 89 | DQ35 | DQ39 | 89 | RAS# | 192 |
| 73 | WE# | 90 | VSS | VSS | 90 | S0# | 193 |
| 74 | CAS# | 91 | CK4# | CK5 | 91 | VDDQ | 194 |
| 75 | VDDQ | 92 | CK4 | CK5# | 92 | ODT0 | 195 |
| 76 | S1# | 93 | VSS | VSS | 93 | A13 | 196 |
| 77 | ODT1 | 94 | DQ40 | DQ44 | 94 | VDD | 197 |
| 78 | VDDQ | 95 | DQ41 | DQ45 | 95 | VSS | 198 |
| 79 | VSS | 96 | DQS5# | DQS14 | 96 | DQ36 | 199 |
| 80 | DQ32 | 97 | DQS5 | DQS14# | 97 | DQ37 | 200 |
| 81 | DQ33 | 98 | DQ42 | DQ46 | 98 | VSS | 201 |
| 82 | VSS | 99 | DQ43 | DQ47 | 99 | DM4/DQS13 | 202 |
| 83 | DQS4# | 100 | VSS | VSS | 100 | DQS13# | 203 |
| 84 | DQS4 | 101 | VDDQ | VDDQ | 101 | VSS | 204 |
| 85 | VSS | 102 | A13 | A13 | 102 | DQ38 | 205 |
| 86 | DQ34 | 103 | ODT1 | ODT1 | 103 | DQ39 | 206 |
| 87 | DQ35 | 104 | ODT0 | ODT0 | 104 | VSS | 207 |
| 88 | VSS | 105 | S1# | S1# | 105 | DQ44 | 208 |
| 89 | DQ40 | 106 | VDDQ | VDDQ | 106 | DQ45 | 209 |

FIG. 10C

| Edge connector contacts 112 on first side 114 of substrate 110 | | Contacts 120 on first side 114 of substrate 110 | | Contacts 120 on second side 116 of substrate 110 | | Edge connector contacts 112 on second side 116 of substrate 110 | |
|---|---|---|---|---|---|---|---|
| 90 | DQ41 | 107 | S0# | S0# | 107 | VSS | 210 |
| 91 | VSS | 108 | RAS# | RAS# | 108 | DM5/DQS14 | 211 |
| 92 | DQS5# | 109 | CAS# | CAS# | 109 | DQS14# | 212 |
| 93 | DQS5 | 110 | WE# | WE# | 110 | VSS | 213 |
| 94 | VSS | 111 | VDDQ | VDDQ | 111 | DQ46 | 214 |
| 95 | DQ42 | 112 | BA1 | BA1 | 112 | DQ47 | 215 |
| 96 | DQ43 | 113 | BA0 | BA0 | 113 | VSS | 216 |
| 97 | VSS | 114 | A10/AP | A10/AP | 114 | DQ52 | 217 |
| 98 | DQ48 | 115 | A0 | A0 | 115 | DQ53 | 218 |
| 99 | DQ49 | 116 | VDDQ | VDDQ | 116 | VSS | 219 |
| 100 | VSS | 117 | A1 | A1 | 117 | CLK2/S2# | 220 |
| 101 | SA2 | 118 | A3 | A3 | 118 | CLK2#/S3# | 221 |
| 102 | Test | 119 | A2 | A2 | 119 | VSS | 222 |
| 103 | VSS | 120 | A6 | A6 | 120 | DM6/DQS15 | 223 |
| 104 | DQS6# | 121 | VDDQ | VDDQ | 121 | DQS15# | 224 |
| 105 | DQS6 | 122 | A8 | A8 | 122 | VSS | 225 |
| 106 | VSS | 123 | A4 | A4 | 123 | DQ54 | 226 |
| 107 | DQ50 | 124 | A5 | A5 | 124 | DQ55 | 227 |
| 108 | DQ51 | 125 | A9 | A9 | 125 | VSS | 228 |
| 109 | VSS | 126 | VDDQ | VDDQ | 126 | DQ60 | 229 |
| 110 | DQ56 | 127 | A12 | A12 | 127 | DQ61 | 230 |
| 111 | DQ57 | 128 | A7 | A7 | 128 | VSS | 231 |
| 112 | VSS | 129 | A11 | A11 | 129 | DM7/DQS16 | 232 |
| 113 | DQS7# | 130 | S2# | S2# | 130 | DQS16# | 233 |
| 114 | DQS7 | 131 | VDDQ | VDDQ | 131 | VSS | 234 |
| 115 | VSS | 132 | S3# | S3# | 132 | DQ62 | 235 |
| 116 | DQ58 | 133 | BA2 | BA2 | 133 | DQ63 | 236 |
| 117 | DQ59 | 134 | CKE1 | CKE1 | 134 | VSS | 237 |
| 118 | VSS | 135 | CKE0 | CKE0 | 135 | VDDSPD | 238 |
| 119 | SDA | 136 | VDDQ | VDDQ | 136 | SA0 | 239 |
| 120 | SCL | 137 | VSS | VSS | 137 | SA1 | 240 |
| | | 138 | DQ48 | DQ52 | 138 | | |
| | | 139 | DQ49 | DQ53 | 139 | | |
| | | 140 | DQS6# | DQS15 | 140 | | |
| | | 141 | DQS6 | DQS15# | 141 | | |
| | | 142 | DQ50 | DQ54 | 142 | | |
| | | 143 | DQ51 | DQ55 | 143 | | |
| | | 144 | VSS | VSS | 144 | | |
| | | 145 | CK6# | CK7 | 145 | | |
| | | 146 | CK6 | CK7# | 146 | | |
| | | 147 | VSS | VSS | 147 | | |
| | | 148 | DQ56 | DQ60 | 148 | | |
| | | 149 | DQ57 | DQ61 | 149 | | |
| | | 150 | DQS7# | DQS16 | 150 | | |
| | | 151 | DQS7 | DQS16# | 151 | | |
| | | 152 | DQ58 | DQ62 | 152 | | |
| | | 153 | DQ59 | DQ63 | 153 | | |
| | | 154 | VSS | VSS | 154 | | |

ELECTRONIC MODULE WITH FLEXIBLE PORTION

RELATED APPLICATIONS

This application is a continuation of U.S. patent application Ser. No. 13/231,870, filed Sep. 13, 2011, which is a continuation of U.S. patent application Ser. No. 12/874,900, filed Sep. 2, 2010, now U.S. Pat. No. 8,033,836, which is a continuation of U.S. patent application Ser. No. 12/237,162, filed Sep. 24, 2008, now U.S. Pat. No. 7,881,097, which is a continuation of U.S. patent application Ser. No. 11/511,523, filed Aug. 28, 2006, now U.S. Pat. No. 7,442,050, which claims the benefit of priority from U.S. Provisional Patent Application No. 60/712,156, filed Aug. 29, 2005. The disclosures of each of these references are incorporated in their entirety by reference herein.

BACKGROUND

1. Field of the Invention

This application relates generally to electronic circuitry and modules for computer-based applications, and more particularly to circuit cards, printed circuit boards, and memory modules.

2. Description of Related Art

Computer systems often utilize modules comprising one or more circuit cards or printed circuit boards (PCBs). Each PCB has one or more components (e.g., integrated circuits or ICs) mounted thereon, and the components can be mounted on one side or on both sides of the PCB. In certain computer systems, the PCBs of the module are stacked next to one another to increase the functionality of the module. For example, board stacking is a method used to increase the memory density in memory subsystems. The technique is also used to increase the device density of other components, such as logic. Stacking enhances the capability of the subsystem, particularly if components are assembled on each of the two sides of each of the stacked PCB. In such configurations, the components mounted on a neighboring side of a neighboring PCB. Such components mounted in close proximity to the PCB can require complicated connections to the PCB. Stacked PCB configurations in the prior art have used flexible circuitry or flex circuits to prove electrical connections between the stacked PCBs, but these configurations have been limited by the characteristics of the flexible circuitry.

Stacking configurations can cause problems due to power dissipation in the components which are in close proximity. Some or all of the components can generate significant amounts of heat, which can raise the temperature of the component itself or of the surrounding components of the module. The narrow air gap between the components on either side of the stacked PCBs prevents air flow which would otherwise keep the components within their specified operating temperature ranges. The raised temperature of these components can have harmful effects on the performance of the components, causing them to malfunction.

Prior art systems utilize heat spreaders to radiate the heat away from the heat-generating component and away from the surrounding components of the module. Such prior art heat spreaders are mounted over the heat-generating component. In stacked configurations, the prior art heat spreaders are typically mounted over components on an outside surface of the PCB (i.e., a surface away from a neighboring PCB). While these prior art heat spreaders can dissipate heat generated by the components on the outside surface of the PCB, components on the inside surfaces would remain hot. In addition, the components on the outside surface of the PCB are effectively cooled by air flowing across the component from a ventilation fan. However, the narrow air gap between the stacked PCBs would allow very little cool air from the ventilation fan to cool the components on the inside surfaces to within the specified operating temperatures.

Computer systems typically have a plurality of sockets into which memory modules can be releasably inserted to electrically couple the memory module with various other components of the computer system. Conventional dual in-line memory modules (DIMMs) have a printed circuit board (PCB) with one edge having electrical contacts which are designed to fit into these sockets and to be electrically coupled with corresponding electrical contacts in the socket. Because these sockets are often in proximity to one another (e.g., spaced with approximately 9 millimeters on either side of the socket), there is a limited amount of space between the sockets which thereby limits the dimensions of a memory module installed therein.

SUMMARY OF THE INVENTION

In certain embodiments, a circuit comprises a first plurality of contacts and a flexible portion comprising a dielectric layer, a second plurality of contacts, and a plurality of electrical conduits extending across a region of the flexible portion. The plurality of electrical conduits is in electrical communication with one or more contacts of the first plurality of contacts and with the second plurality of contacts. The flexible portion further comprises an electrically conductive layer extending across the region of the flexible portion. The electrically conductive layer is superposed with the plurality of electrical conduits with the dielectric layer therebetween. The electrically conductive layer does not overlay one or more portions of the dielectric layer in the region of the flexible portion.

In certain embodiments, a module comprises a plurality of connectors configured to be in electrical communication with corresponding socket connectors of a computer system. The module further comprises a plurality of contacts configured to be in electrical communication with a plurality of electrical components. The module further comprises a flexible portion comprising a dielectric layer and a plurality of electrical conduits extending across a region of the flexible portion. The plurality of electrical conduits provides electrical conductivity between the plurality of connectors and the plurality of contacts. The flexible portion further comprises an electrically conductive layer extending across the region of the flexible portion. The electrically conductive layer is superposed with the plurality of electrical conduits with the dielectric layer therebetween. The electrically conductive layer does not overlay one or more portions of the dielectric layer in the region of the flexible portion.

In certain embodiments, a flexible connector comprises a dielectric layer, a plurality of electrical conduits, and an electrically conductive layer. The plurality of electrical conduits extend across a region of the flexible connector. The electrically conductive layer extends across the region of the flexible connector and is superposed with the plurality of electrical conduits with the dielectric layer therebetween. The electrically conductive layer does not overlay one or more portions of the dielectric layer in the region of the flexible connector.

In certain embodiments, an electronic module for a computer system is provided. The electronic module comprises a first printed-circuit board (PCB) having a first side and a second side, a first plurality of electrical components mounted on the first side of the first PCB, and a second plurality of electrical components mounted on the second side of the first PCB. The electronic module further comprises a second PCB having a first side facing towards the first PCB and a second side facing away from the first PCB, a third plurality of electrical components mounted on the first side of the second PCB, and a fourth plurality of electrical components mounted on the second side of the second PCB. The electronic module further comprises at least one electrical conduit electrically coupling the third plurality of electrical components to the first PCB and electrically coupling the fourth plurality of electrical components to the first PCB. The electronic module further comprises a heat spreader comprising a thermally conductive material. The heat spreader comprises a first portion thermally coupled to the first plurality of electrical components, a second portion thermally coupled to the second plurality of electrical components and to the third plurality of electrical components, and a third portion thermally coupled to the fourth plurality of electrical components.

In certain embodiments, a circuit card comprises a rigid portion having a first plurality of contacts configured to be in electrical communication with a plurality of memory devices. The circuit card further comprises a flexible connector coupled to the rigid portion. The flexible connector has a first side and a second side. The flexible connector comprises a dielectric layer, a second plurality of contacts configured to be in electrical communication with a substrate, and a plurality of electrical conduits on the first side of the flexible connector and extending from the rigid portion to the second plurality of contacts. The plurality of electrical conduits is in electrical communication with one or more contacts of the first plurality of contacts and with the second plurality of contacts. The flexible connector further comprises an electrically conductive layer on the second side of the flexible connector. The electrically conductive layer is superposed with the plurality of electrical conduits with the dielectric layer therebetween. The electrically conductive layer does not cover one or more portions of the second side of the flexible connector, thereby providing improved flexibility of the flexible connector.

In certain embodiments, a memory module comprises a main printed-circuit board (PCB) having a first side and a second side. The main PCB comprises a plurality of edge connectors configured to be in electrical communication with corresponding socket connectors of a computer system. The main PCB further comprises a first plurality of contacts in electrical communication with the plurality of edge connectors. The memory module further comprises a first daughter circuit card positioned on the first side of the main PCB and oriented generally parallel to the main PCB. The first daughter circuit card comprises a rigid portion and a plurality of memory devices mounted thereto. The first daughter circuit card further comprises a flexible connector and a second plurality of contacts thereon. The second plurality of contacts is in electrical communication with the first plurality of contacts. The flexible connector has a first side and a second side. The flexible connector comprises a dielectric layer and a plurality of electrical conduits on the first side of the flexible connector. The plurality of electrical conduits is in electrical communication with the plurality of memory devices and the second plurality of contacts. The flexible connector further comprises an electrically conductive layer on the second side of the flexible connector. The electrically conductive layer is superposed with the plurality of electrical conduits with the dielectric layer therebetween. The electrically conductive layer does not cover one or more portions of the second side of the flexible connector, thereby providing improved flexibility of the flexible connector.

In certain embodiments, a computer system comprises a memory module comprising a printed-circuit board (PCB) having a first side and a second side. The PCB comprises a plurality of edge connectors configured to be in electrical communication with corresponding socket connectors of a computer system. The PCB further comprises a first plurality of contacts in electrical communication with the plurality of edge connectors. The memory module further comprises a first daughter circuit card positioned on the first side of the PCB and oriented generally parallel to the PCB. The first daughter circuit card comprises a rigid portion and a plurality of memory devices mounted thereto. The first daughter circuit card further comprises a flexible connector and a second plurality of contacts thereon. The second plurality of contacts is in electrical communication with the first plurality of contacts. The flexible connector has a first side and a second side. The flexible connector comprises a dielectric layer and a plurality of electrical conduits on the first side of the flexible connector. The plurality of electrical conduits is in electrical communication with the plurality of memory devices and the second plurality of contacts. The flexible connector further comprises an electrically conductive layer on the second side of the flexible connector. The electrically conductive layer is superposed with the plurality of electrical conduits with the dielectric layer therebetween. The electrically conductive layer does not cover one or more portions of the second side of the flexible connector; thereby providing improved flexibility of the flexible connector.

In certain embodiments, an electronic circuit module for a computer system comprises a first printed-circuit board (PCB) having an edge connector, a first side, and a second side. The electronic circuit module further comprises a first plurality of electrical components mounted on the first side of the first PCB. The first plurality of electrical components is electrically coupled to the edge connector. The electronic circuit module further comprises a second plurality of electrical components mounted on the second side of the second PCB. The second plurality of electrical components is electrically coupled to the edge connector. The electronic circuit module further comprises a second PCB having a first side facing towards the first PCB and a second side facing away from the first PCB. The electronic circuit module further comprises a third plurality of electrical components mounted on the first side of the second PCB. The electronic circuit module further comprises a fourth plurality of electrical components mounted on the second side of the second PCB. The electronic circuit module further comprises at least one electrical conduit between the first PCB and the second PCB. The at least one electrical conduit electrically couples the third plurality of electrical components to the edge connector and electrically couples the fourth plurality of electrical components to the edge connector. The electronic circuit module further comprises a heat spreader comprising a thermally conductive material. The heat spreader comprises a first portion thermally coupled to the first plurality of electrical components. The heat spreader further comprises a second portion thermally coupled to the second plurality of electrical components and to the third plurality of electrical components. The heat spreader further comprises a third portion thermally coupled to the fourth plurality of electrical components.

BRIEF DESCRIPTION OF THE DRAWINGS

FIGS. 8A-8C provides an example configuration of the contacts on the first side and the second side of the substrate (corresponding to the contacts on each circuit card) and the edge connector contacts of the substrate for a DDR1 RDIMM compatible with certain embodiments described herein.

FIGS. 9A-9C provides an example configuration of the contacts on the first side and the second side of the substrate and the edge connector contacts of the substrate for a DDR2 RDIMM with registers and PLL circuit elements on the circuit card compatible with certain embodiments described herein.

FIGS. 10A-10C provides an example configuration of the contacts on the first side and the second side of the substrate and the edge connector contacts of the substrate for a DDR2 RDIMM with registers and PLL circuit elements on the substrate compatible with certain embodiments described herein FIGS. 11A-11C schematically illustrates three views of another example circuit card compatible with certain embodiments described herein.

FIG. 12A has the following example dimensions: α=13.2 millimeters; β=8.08 millimeters; ψ=7.25 millimeters; μ=14.70 millimeters; and τ=3.62 millimeters. FIG. 12C has the following example dimensions; α=20.00 millimeters; β=7.500 millimeters; ψ=7.25 millimeters; μ=18.300 millimeters; and τ=2.870 millimeters.

FIG. 13A has the following example dimensions; α=126.30 millimeters; β=133.33 millimeters; ψ=19.50 millimeters; μ=4.04 millimeters; and τ=18.32 millimeters.

FIG. 14A has the following example dimensions; α=1.270 millimeters; β=7.500 millimeters; ψ=18.781 millimeters, μ=2.865 millimeters; τ=18.000 millimeters; ∈=9.500 millimeters; ω=19.718 millimeters; π=1.143 millimeters; and γ=21.509 millimeters.

FIG. 14B has the following example dimensions; α=21.50 millimeters; and β=12.00 millimeters FIG. 15 schematically illustrates a pair of example modules each having a mother PCB and a single daughter PCB in accordance with certain embodiments described herein.

DETAILED DESCRIPTION

Figure 1A:
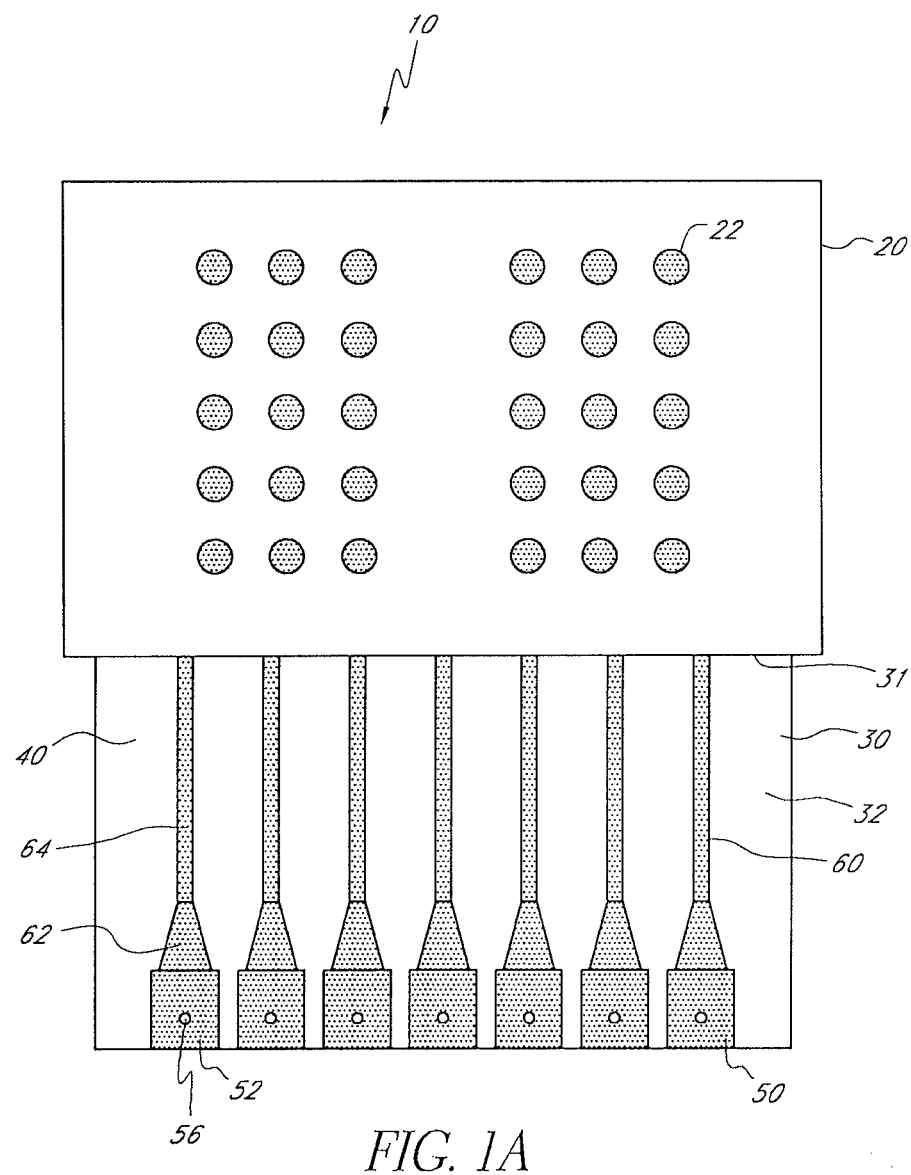
FIGS. 1A-1C schematically illustrate three views of an example circuit card having a rigid portion that includes a portion of the layers which comprise the flexible connector in accordance with certain embodiments described herein.
Figure 1B:
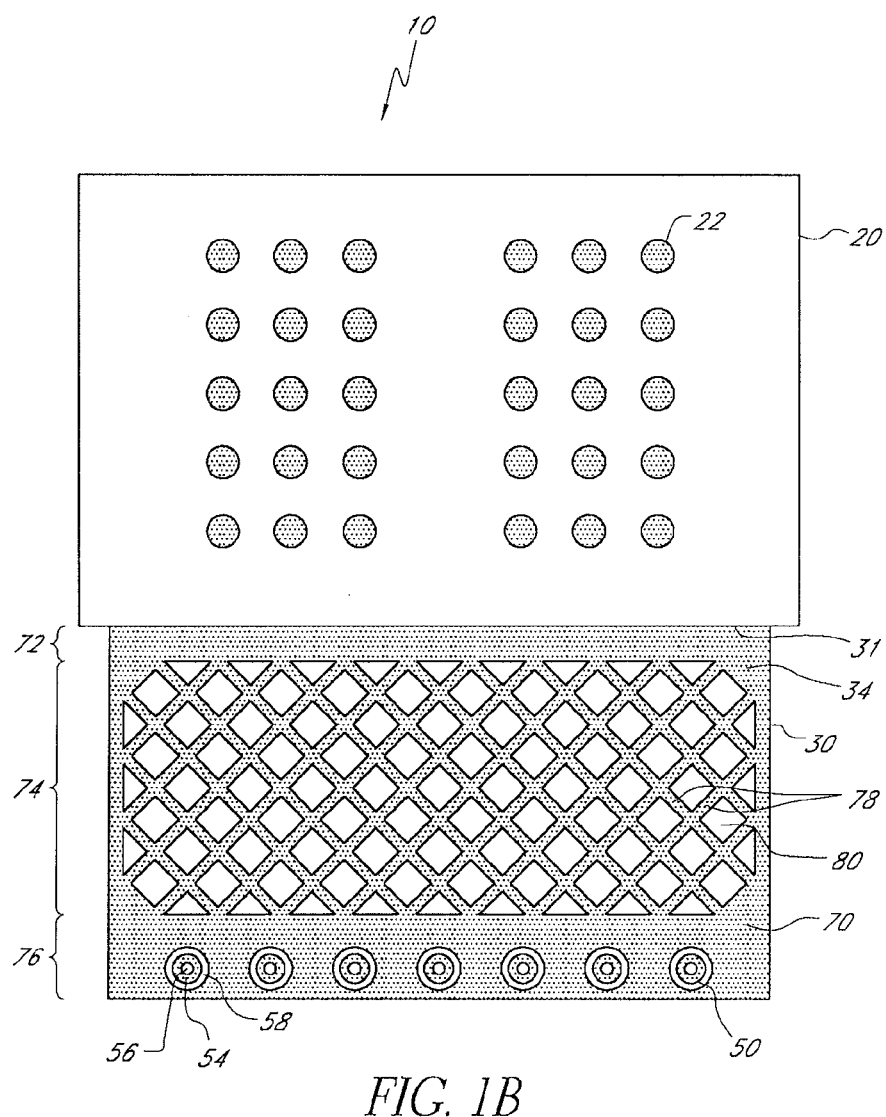
Figure 1C:
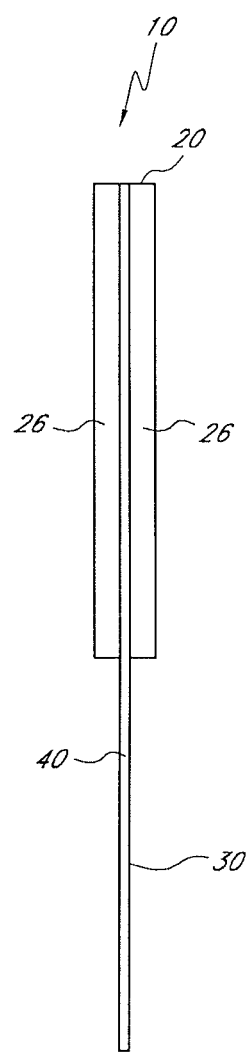

FIGS. 1A-1C schematically illustrate three views of an example circuit card 10 compatible with certain embodiments described herein. The circuit card 10 comprises a rigid portion 20 having a first plurality of contacts 22 configured to be in electrical communication with a plurality of memory devices (not shown). The circuit card 10 further comprises a flexible connector 30 coupled to the rigid portion 20. The flexible connector 30 has a first side 32 and a second side 34. The flexible connector 30 comprises a dielectric layer 40 and a second plurality of contacts 50 configured to be in electrical communication with a substrate (not shown). The flexible connector 30 further comprises a plurality of electrical conduits 60 on the first side 32 of the flexible connector 30 and extending from the rigid portion 20 to the second plurality of contacts 50. The plurality of electrical conduits 60 are in electrical communication with one or more contacts 22 of the first plurality of contacts 22 and with the second plurality of contacts 50. The flexible connector 30 further comprises an electrically conductive layer 70 on the second side 34 of the flexible connector 30. The electrically conductive layer 70 is superposed with the plurality of electrical conduits 60 with the dielectric layer 40 therebetween. The electrically conductive layer 70 does not cover one or more portions 80 of the second side 34 of the flexible connector 30, thereby providing improved flexibility of the flexible connector 30.

In certain embodiments, the rigid portion 20 is configured to have a plurality of circuit components (e.g., memory devices) mounted thereon. In certain embodiments, the rigid portion 20 is flexible prior to having the components mounted thereon, but is rigid once the components are mounted thereon. In certain other embodiments, the rigid portion 20 is rigid both prior to and after having the components mounted thereon. The rigid portion 20 of certain embodiments is sufficiently rigid to provide structural stability to the plurality of circuit components when the components are mounted on the rigid portion 20.

The rigid portion 20 of certain embodiments comprises a printed-circuit board (PCB) comprising a laminate structure (e.g., FR4) of fiberglass saturated with epoxy resin and electrically conductive (e.g., copper) traces and vias. These traces and vias provide electrical conductivity to the first plurality of contacts 22. In certain embodiments, the rigid portion 20 comprises an eight-layer PCB, while in certain other embodiments, the rigid portion 20 comprises four, six, or other number of layers. In certain embodiments, the rigid portion 20 has a generally rectangular shape, while in certain other embodiments, the rigid portion 20 has other shapes (e.g., trapezoidal, parallelogram).

Figure 2:
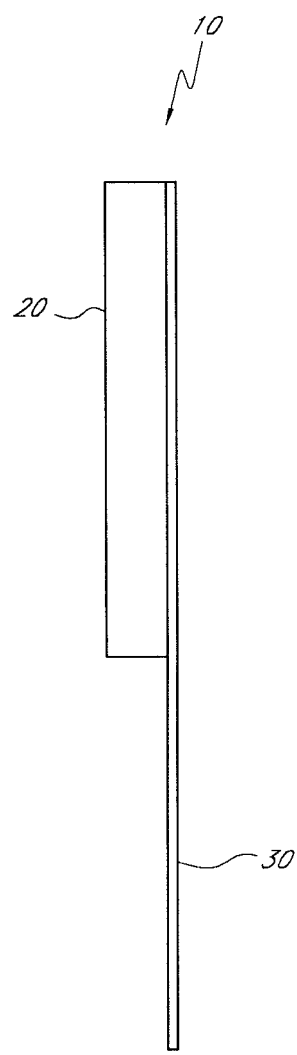
FIG. 2 schematically illustrates a side view of an example circuit card having a rigid portion that includes a portion of the layers which comprise the flexible connector on one side of the rigid portion in accordance with certain embodiments described herein.

In certain embodiments, the rigid portion 20 comprises a portion of the layers which comprise the flexible connector 30. As schematically illustrated by FIG. 1C, the rigid portion 20 of certain such embodiments comprises a pair of PCBs 26 with a portion of the dielectric layer 40, a portion of the plurality of electrical conduits 60, and a portion of the electrically conductive layer 70 sandwiched therebetween. In certain other embodiments, the rigid portion 20 has a portion of the layers which comprise the flexible connector 30 on one side of the rigid portion 20, as schematically illustrated by FIG. 2.

The rigid portion 20 of certain embodiments further comprises passive electrical components (e.g., resistors, capacitors) which are mounted on the rigid portion 20 and are electrically coupled to the first plurality of contacts 22. In certain such embodiments, at least some of these passive electrical components are mounted on at least one of the sides of the rigid portion 20, while in certain other such embodiments, at least some of these passive electrical components are within the rigid portion 20 (e.g., embedded between laminate layers).

In certain embodiments, as schematically illustrated by FIGS. 1A and 1B, the first plurality of contacts 22 are on both sides of the rigid portion 20. In certain other embodiments, the first plurality of contacts 22 is on a single side of the rigid portion 20. The first plurality of contacts 22 of certain embodiments comprise ball-grid arrays (BGAs), while other types of contacts 22 are also compatible with certain embodiments described herein. In certain embodiments, one or more of the contacts 22 are electrically coupled to one or more of the electrical conduits 60 of the flexible connector 30. In certain other embodiments, one or more of the contacts 22 are electrically coupled to the electrically conductive layer 70 of the flexible connector 30.

In certain embodiments, at least some of the contacts 22 are configured to be electrically coupled to a plurality of memory devices. In certain other embodiments, at least some of the contacts 22 are configured to be electrically coupled to other circuit components, including but not limited to, passive electrical components (e.g., resistors, capacitors), phase-lock loop circuitry, registers, and advanced memory buffers (AMBs).

In certain embodiments, the flexible connector 30 has a laminate structure with the dielectric layer 40 sandwiched between two electrically conductive layers (e.g., the plurality of electrical conduits 60 and the electrically conductive layer 70). As used herein, the term "layer" is used in its broadest ordinary meaning. For example, a layer may comprise a single material having a generally uniform thickness or may comprise multiple sublayers each comprising a different material. Although many of the layers are depicted herein as having a relatively thin sheet-like expanse or region lying over or under another, a layer as used herein may comprise a shorter expanse or region or multiple expanses or regions.

In certain embodiments, the flexible connector 30 has a generally rectangular shape, while in certain other embodiments, the flexible connector 30 has other shapes (e.g., trapezoidal, parallelogram). The flexible connector 30 of certain embodiments is coupled to the rigid portion 20 along at least one edge 31 of the flexible connector 30.

As schematically illustrated by FIGS. 1A-1C, the flexible connector 30 of certain embodiments comprises only the dielectric layer 40, the electrical conduits 60, and the electrically conductive layer 70. This configuration is sometimes described as "two-layer flex," referring to the two electrically conductive layers. In certain other embodiments, the flexible connector 30 includes four, five, or other number of layers which include one or more electrically conductive layers and one or more electrically insulating layers. For example, the flexible connector 30 can comprise five layers: the three layers of FIGS. 1A-1C plus two additional insulating layers on either side of the conductive layers to protect and/or insulate the conductive layers. However, generally fewer layers are more advantageous by providing more flexibility of the flexible connector 30 as compared to structures with more layers.

In certain embodiments, the dielectric layer 40 comprises one or more polymer materials, examples of which include, but are not limited to, polyimide (e.g., Kapton®) and polyester. The thickness of the dielectric layer 40 of certain embodiments is in a range between about 25 microns and about 100 microns, although other thicknesses are also compatible with certain embodiments described herein. In certain embodiments, the dielectric layer 40 is a generally continuous sheet of material, while in certain other embodiments, the dielectric layer 40 has holes, slits, or other discontinuities therein. In certain embodiments, the dielectric layer 40 has a generally rectangular shape, while in certain other embodiments, the dielectric layer 40 has other shapes (e.g., trapezoidal, parallelogram).

In certain embodiments, the second plurality of contacts 50 comprise an electrically conductive material (e.g., copper) that is configured to be electrically coupled (e.g., soldered) to corresponding contacts on a substrate (not shown). As schematically illustrated in FIGS. 1A and 1B, the contacts 50 of certain embodiments comprise an electrically conductive first region 52 on the first side 32 of the flexible connector 30, an electrically conductive second region 54 on the second side 34 of the flexible connector 30, and a hole 56 through the flexible connector 30 having an inner surface coated with the electrically conductive material and electrically coupling the first region 52 and the second region 54. The second region 54 is generally surrounded by a gap 58 in the electrically conductive layer 70 that electrically isolates the second region 54 from the electrically conductive layer 70 on the second side 34 of the flexible connector 30. While FIGS. 1A and 1B schematically illustrate the first region 52 as being generally square and the second region 54 as being generally circular, other shapes of the first region 52 and the second region 54 are also compatible with certain embodiments described herein.

In certain embodiments, each of the contacts 50 of the second plurality of contacts 50 has a diameter in a range between about 0.25 millimeter and about 0.5 millimeter. The second plurality of contacts 50 of certain embodiments are positioned generally along one edge of the flexible connector 30 and are spaced from one another, as schematically illustrated by FIGS. 1A and 1B. The pitch spacing between the contacts 50 of certain embodiments is about 1 millimeter, about 0.8 millimeter, about 0.5 millimeter, or smaller.

In certain embodiments, the plurality of electrical conduits 60 comprises an electrically conductive material (e.g., copper) that electrically couples at least some of the first plurality of contacts 22 to at least some of the second plurality of contacts 50. The conduits 60 of certain embodiments have a thickness in a range between about 0.025 millimeter and about 0.25 millimeter. The conduits 60 of certain embodiments are spaced from one another along the first side 32 of the flexible connector 30, thereby exposing portions of the underlying dielectric layer 40. In certain such embodiments, the conduits 60 are spaced from one another with a pitch spacing generally equal to the pitch spacing between the contacts 50. In certain embodiments, the conduits 60 extend across a length of the first side 32 of the flexible connector 30 and are generally straight and parallel to one another, as schematically illustrated by FIG. 1B. In certain other embodiments, at least one conduit 60 has at least one curve or non-zero angle as it extends across the first side 32 of the flexible connector 30. In certain embodiments, at least one conduit 60 has one or more branch points at which the conduit 60 branches or forks in two or more separate directions.

As schematically illustrated by FIG. 1A, in certain embodiments, each conduit 60 comprises a tapered section 62 connected to one of the contacts 50 and an elongate section 64 extending along a length of the first side 32 of the flexible connector 30 from the rigid portion 20 to the tapered section 62. In certain embodiments, the tapered section 62 has a length in a range between about 0.8 millimeter and about 1.5 millimeters and a width in a range between about 0.025 millimeter and about 0.8 millimeter. As schematically illustrated by FIG. 1A, in certain embodiments, the portion of the tapered section 62 coupled to the contact 50 has a width generally equal to the width of the contact 50, and the portion of the tapered section 62 coupled to the elongate section 64 has a width generally equal to the width of the elongate section 64. The elongate section 64 of certain embodiments has a width that is smaller than the width of the contacts 50 (e.g., in a range between about 0.025 millimeter and about 0.25 millimeter).

In certain embodiments, the electrically conductive layer 70 comprises an electrically conductive material (e.g., copper). The layer 70 of certain embodiments has a thickness in a range between about 17.5 microns and about 70 microns. In certain embodiments, the layer 70 extends generally across at least a portion of the second side 34 of the flexible connector 30. As schematically illustrated in FIG. 1B, the layer 70 extends from a first region 72 proximate to the rigid portion 20, across a second region 74, to a third region 76 superposed with the contacts 50 on the first side 32 of the flexible connector 30, thereby providing electrical conductivity from the first region 72 through the second region 74 to the third region 76.

The layer 70 of certain embodiments does not cover one or more portions 80 of the second side 34 of the flexible connector 30. As schematically illustrated in FIG. 1B, in certain embodiments, the portions 80 of the second side 34 that are not covered by the layer 70 are in the second region 74, thereby exposing the underlying dielectric layer 40. In certain other embodiments, the portions 80 can also be in the first region 72 and/or in the third region 76. Certain embodiments described herein advantageously provide improved flexibility of the flexible connector 30 for bending in a direction generally perpendicular to the flexible connector 30 by having the layer 70 not cover one or more portions 80 of the second side 34 of the flexible connector 30, thereby avoiding having conductive material over these portions 80 which would otherwise reduce the flexibility of the flexible connector 30.

As schematically illustrated by FIG. 1B, in certain embodiments, the layer 70 in the second region 74 comprises a plurality of metal lines 78 in a cross-hatched pattern which define the portions 80 therebetween. The portions 80 can have various shapes, including but not limited to, square, parallelogram, trapezoidal, triangular, hexagonal, circular, or combinations thereof. For example, as schematically illustrated in FIG. 1B, some of the portions 80 have a generally square shape and some of the portions 80 have a generally triangular shape. In certain embodiments, the metal lines 78 have a width in a range between about 0.025 millimeter and about 0.25 millimeter, and a pitch spacing in a range between about 0.15 millimeter and about 1.5 millimeters. In certain embodiments, the width of the metal lines 78 are substantially constant across the length of the metal lines 78, while in certain other embodiments, the width varies across the length of the metal lines 78. The metal lines 78 shown in FIG. 1B are generally oriented at a non-zero angle (e.g., 45 degrees) relative to one or more edges of the flexible connector 30, while other orientations (e.g., parallel to at least one edge of the flexible connector 30) are also compatible with certain embodiments described herein.

Figure 3:
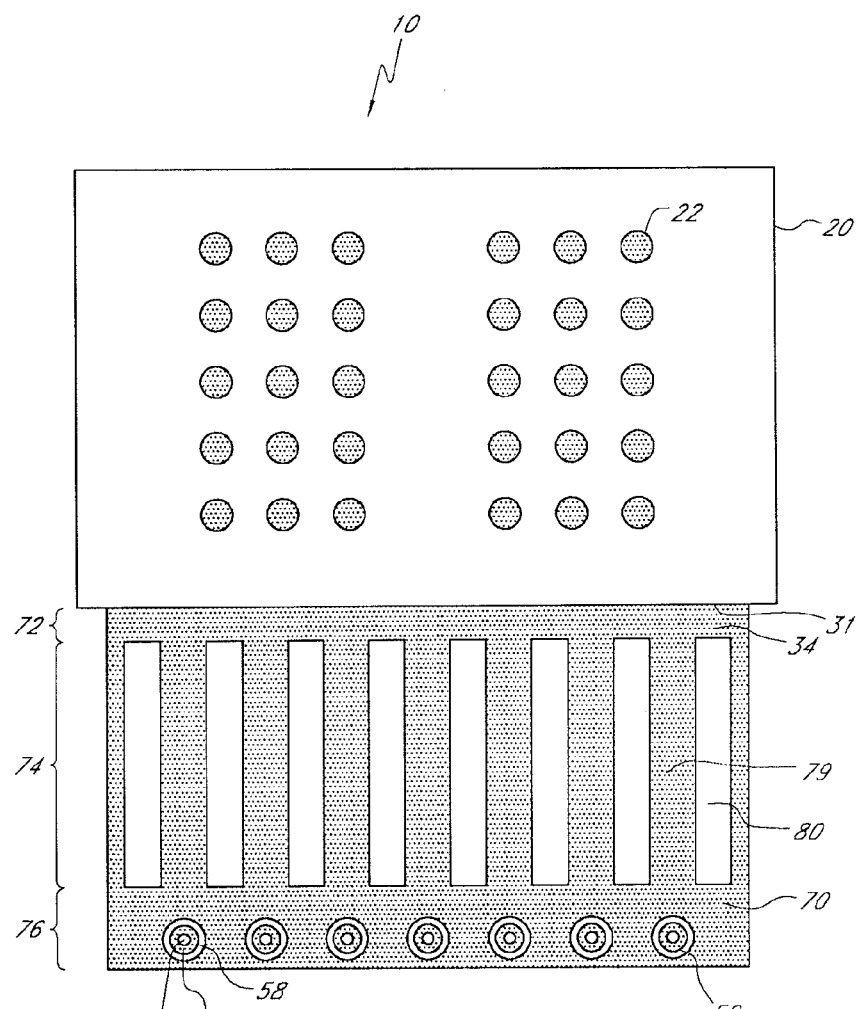
FIG. 3 schematically illustrates an example circuit card having an electrically conductive layer which comprises a plurality of metal traces that are superposed and generally parallel with the plurality of electrical conduits with the dielectric layer therebetween.

In certain other embodiments, as schematically illustrated by FIG. 3, the layer 70 in the second region 74 comprises a plurality of metal traces 79 that are superposed and generally parallel with the plurality of electrical conduits 60 with the dielectric layer 40 therebetween. The metal traces 79 of certain embodiments are wider than the corresponding conduits 60 on the first side 32 of the flexible connector 30. In certain embodiments, the width of the metal traces 79 is in a range between about 0.075 millimeter and about 0.75 millimeter. In certain embodiments, the width of the metal traces 79 is substantially constant across the length of the metal traces 79, while in certain other embodiments, the width varies across the length of the metal traces 79.

In certain embodiments, the layer 70 serves as a ground plane for at least a portion of the circuit card 10 along the flexible connector 30. In certain other embodiments, the layer 70 serves as a power plane for at least a portion of the circuit card 10 along the flexible connector 30. By serving as a ground or power plane that is superposed with the conduits 60 on the first side 32 of the flexible connector 30, the layer 70 of certain embodiments advantageously enhances signal integrity and impedance matching of signals propagating through the conduits 60.

Figure 4:
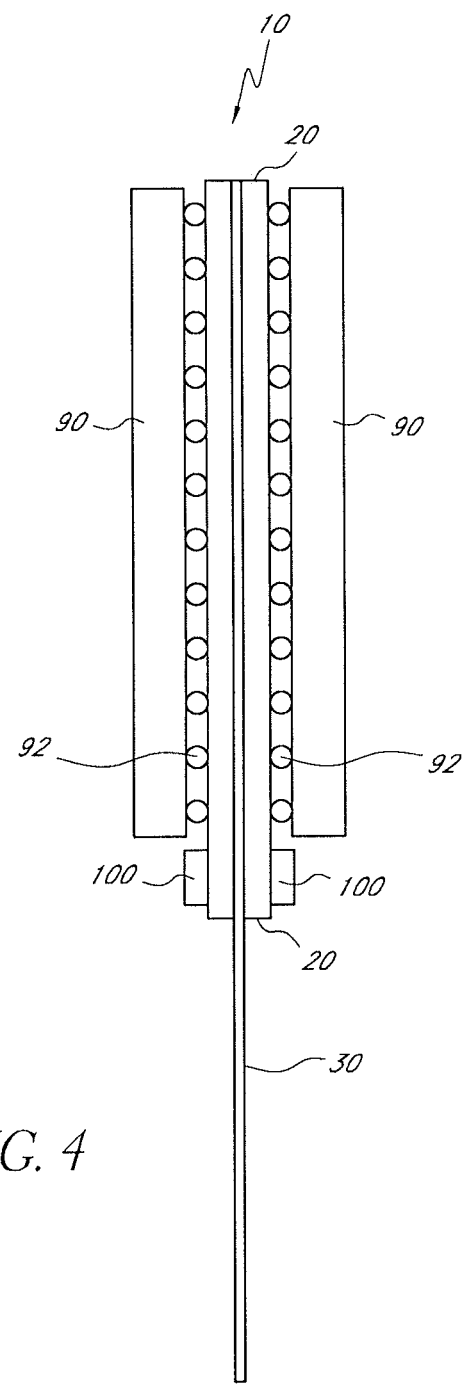
FIG. 4 schematically illustrates an example circuit card having a plurality of memory devices and a plurality of passive components mounted thereto.

FIG. 4 schematically illustrates an edge view of an example circuit card 10 having a plurality of memory devices 90 and a plurality of passive components 100 mounted thereto. Examples of memory devices compatible with certain embodiments described herein include, but are not limited to, DDR1, DDR2, or DDR3 dynamic random-access memory (DRAM) components in dual-die packages (DDP) with BGA connections, and with example memory capacities such as 1 Gb (256M×4-bit) or 512 Mb (128M×4-bit). Other types of memory devices are also compatible with certain embodiments described herein. The memory devices 90 of certain embodiments are mounted on the rigid portion 20 by a plurality of solder balls 92 as schematically illustrated by FIG. 4 which also provides electrical connections between the contacts 22 of the rigid portion 20 and corresponding contacts of the memory devices 90.

Figure 5A:
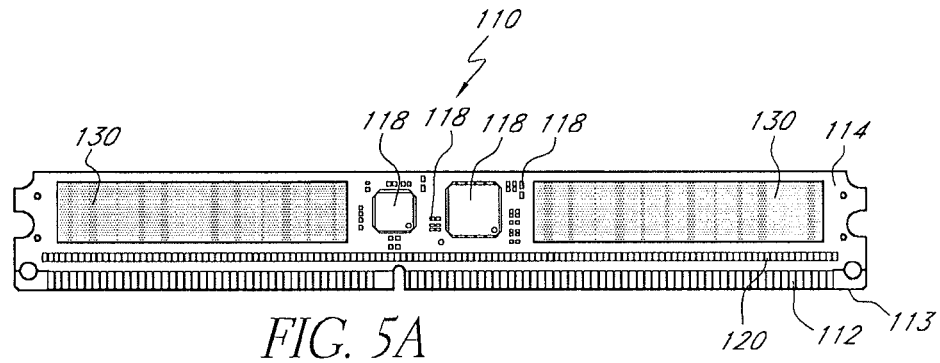
FIGS. 5A-5C schematically illustrates an example substrate that is configured to be electrically coupled to a circuit card compatible with certain embodiments described herein.
Figure 5B:
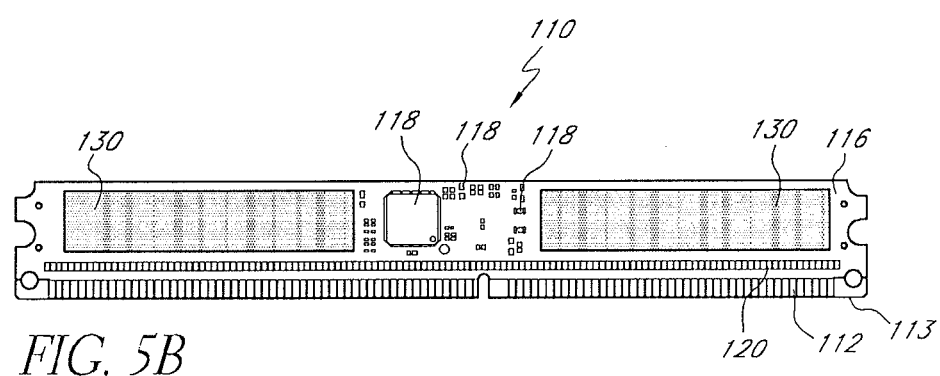
Figure 5C:
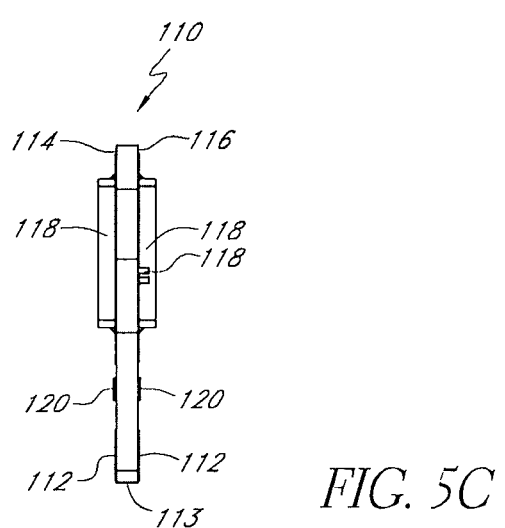

FIGS. 5A-5C schematically illustrates a substrate 110 that is configured to be electrically coupled to a circuit card 10 compatible with certain embodiments described herein. In certain embodiments, the substrate 110 is a printed-circuit board with dimensions which are selected to be compatible with installation of the substrate 110 in a computer system. For example, in certain embodiments, the substrate 110 has a height of 18.3 millimeters and a length of 133.0 millimeters.

In certain embodiments, the substrate 110 comprises a plurality of edge connector contacts 112, a first side 114, a second side 116, one or more electrical components 118, and a plurality of surface contacts 120. The edge connector contacts 112 of certain embodiments are positioned along an edge 113 of the substrate 110 on the first side 114 and on the second side 116, and are configured to be releasably mounted to corresponding electrical contacts of a computer system socket (not shown).

In certain embodiments, the one or more electrical components 118 are mounted on the first side 114, on the second side 116, or on both the first side 114 and the second side 116 of the substrate 110. The electrical components 118 mounted on the substrate 110 can comprise various circuit components, including but not limited to, passive electrical components (e.g., resistors, capacitors), memory devices, phase-lock loop circuitry, registers, and advanced memory buffers (AMBs).

The surface contacts 120 of certain embodiments are configured to be electrically coupled (e.g., soldered) to the second plurality of contacts 50 of the circuit card 10. In certain embodiments in which the substrate 110 is configured to be coupled to a single circuit card 10, the surface contacts 120 are on either the first side 114 or the second side 116 of the substrate 110. In certain other embodiments in which the substrate 110 is configured to be coupled to two circuit cards 10, the surface contacts 120 are on both the first side 114 and the second side 116 of the substrate 110. As schematically illustrated by FIGS. 5A and 5B, the surface contacts 120 of certain embodiments are positioned generally along a line parallel to the edge 113 across the first side 114 and generally along a line parallel to the edge 113 across the second side 116. In certain embodiments, the substrate 110 comprises between about 100 and about 170 surface contacts 120 along one side.

In certain embodiments, the substrate 110 comprises at least one thermally conductive layer 130 that is thermally coupled to one or more of the edge connector contacts 112 of the substrate 110. The thermally conductive layer 130 of certain embodiments comprises copper or aluminum and is on either the first side 114, on the second side 116, or one both the first side 114 and the second side 116 of the substrate 110. In certain embodiments, the thermally conductive layer 130 has a thickness in a range between about 17.5 microns and about 100 microns, a height in a range between about 8 millimeters and about 24 millimeters, and a length along the substrate 110 in a range between about 40 millimeters and about 125 millimeters. The thermally conductive layer 130 of certain embodiments is configured to provide a thermal conduit to draw heat from the memory devices 90 in thermal communication therewith, to advantageously provide cooling of the memory devices 90.

Figure 6A:
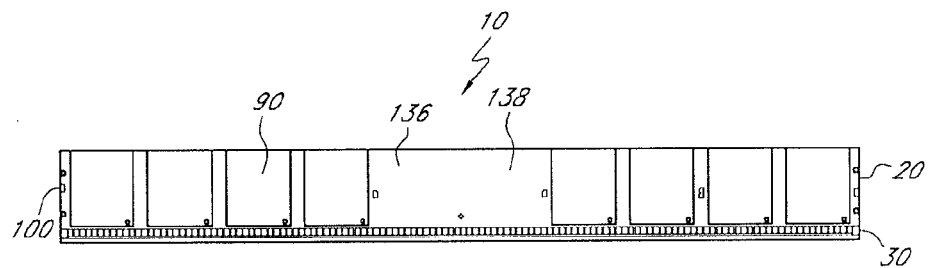
FIGS. 6A-6C schematically illustrate an example circuit card configured to be mounted to the substrate schematically illustrated by FIGS. 5A-5C.
Figure 6B:
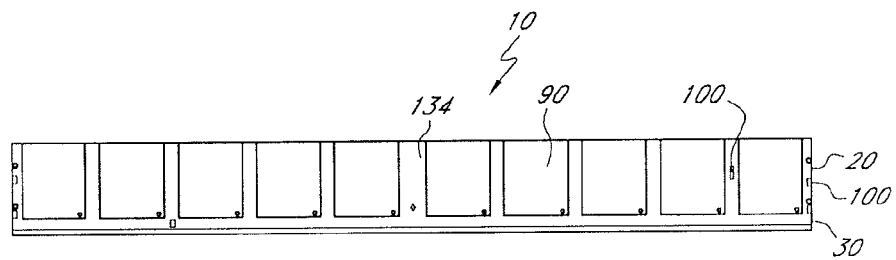
Figure 6C:
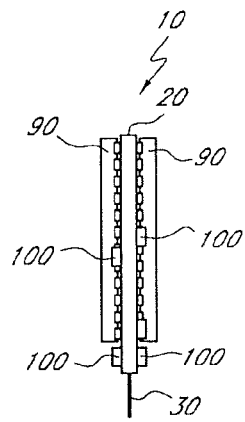

FIGS. 6A-6C schematically illustrate an example circuit card 10 configured to be mounted to the substrate 110 schematically illustrated by FIGS. 5A-5C. The circuit card 10 comprises a plurality of memory devices 90 and passive electrical components 132 (e.g., resistors, capacitors) mounted thereon. As schematically illustrated by FIGS. 6A and 6B, each circuit card 10 has 18 dynamic random-access memory (DRAM) devices 90 mounted thereon, with 10 memory devices 90 mounted on a first side 134 of the rigid portion 20 and 8 memory devices 90 mounted on a second side 136 of the rigid portion 20. The memory devices 90 on the second side 136 of the circuit card 10 are configured to leave a portion 138 of the second side 136 generally free from electrical components mounted thereon.

Figure 7A:
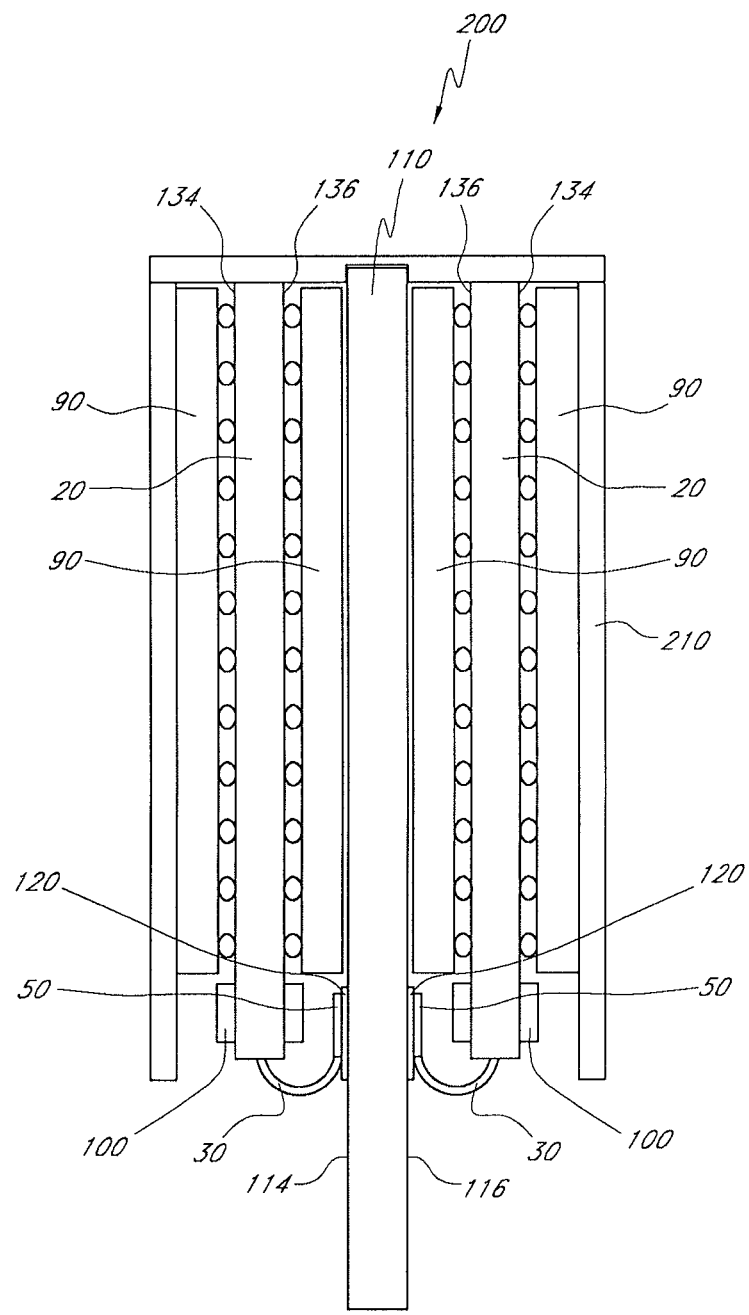
FIG. 7A schematically illustrates an edge view of two example circuit cards compatible with FIGS. 6A-6C mounted on the substrate of FIGS. 5A-5C.
Figure 7B:
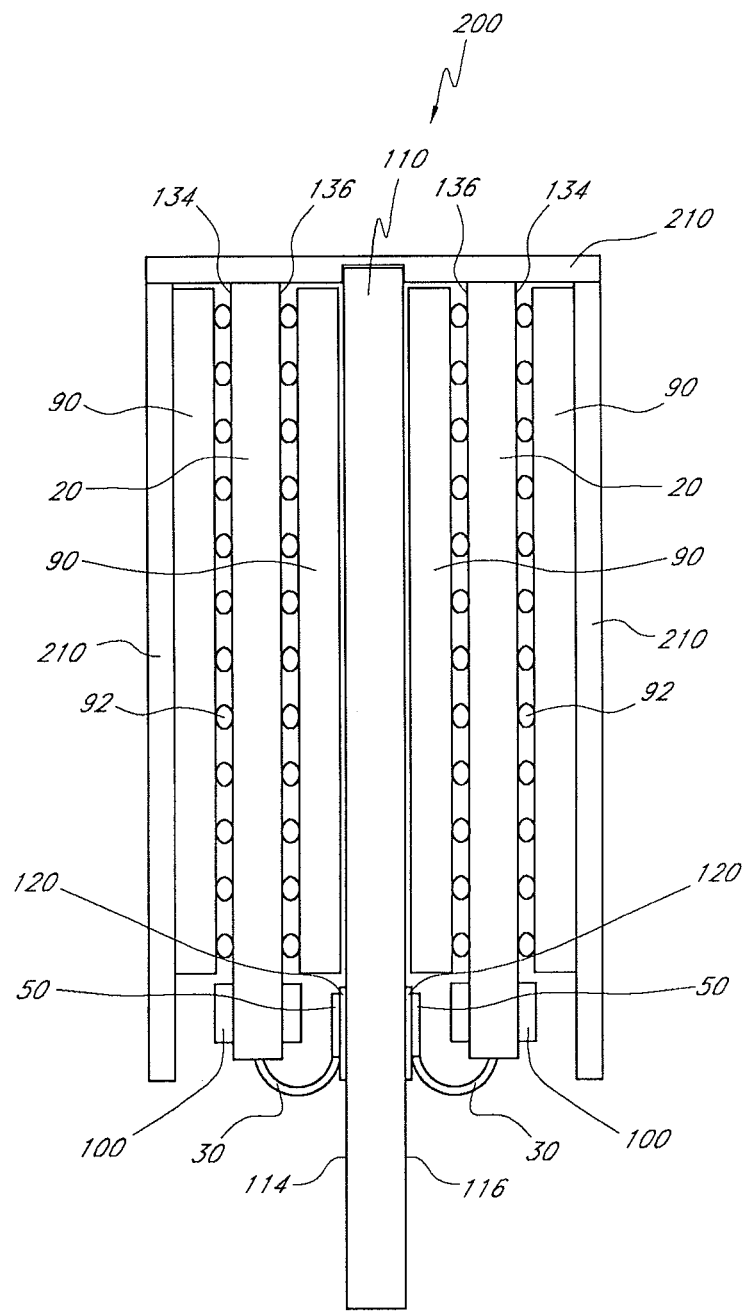
FIG. 7B schematically illustrates an edge view of two example circuit cards compatible with FIG. 2 mounted on the substrate of FIGS. 5A-5C.

FIG. 7A schematically illustrates an edge view of an example memory module 200 comprising two circuit cards 10 compatible with FIGS. 6A-6C mounted on the substrate 110 of FIGS. 5A-5C. FIG. 7B schematically illustrates an edge view of an example memory module 200 comprising two circuit cards 10 compatible with FIG. 2 mounted on the substrate 110 of FIGS. 5A-5C. Exemplary memory modules compatible with certain embodiments described herein include, but are not limited to, dual in-line memory modules (DIMMs) such as fully-buffered DIMMs (FBDIMMs). In certain embodiments, the memory module 200 of FIG. 7A is a 4 GB memory module with thirty-six memory devices (e.g., DDR2 256M×4-bit, 1 Gb DDP DRAM components) arranged in four ranks. In certain embodiments, the memory module 200 of FIG. 7B is a 4 GB memory module with eighteen 2 Gb DDP memory devices arranged in two ranks. Example ranks compatible with certain embodiments described herein are blocks of memory of a fixed depth and having either an "×64-bit" or an "×72-bit" width. For example, 16 or 18 "×4" memory components can be used to form a rank of memory, while 8 or 9 "×8" memory components can be used to form a rank of memory.

While each of FIGS. 7A and 7B schematically illustrates a memory module 200 with two circuit cards 10 mounted on the substrate 110, in certain other embodiments, the memory module 200 comprises only a single circuit card 10 mounted on the substrate 110. Each circuit card 10 is mounted such that the memory devices 90 on the first side 134 of the rigid portion 20 are facing away from the substrate 110 and the memory devices 90 on the second side 136 of the rigid portion 20 are in thermal contact with the thermally conductive layer 130 of the substrate 110. In certain embodiments, a thermally conductive film placed between the memory devices 90 on the second side 136 of the rigid portion 20 and the thermally conductive layer 130 of the substrate 110 advantageously enhances the thermal conductivity between the memory devices 90 and the thermally conductive layer 130. The circuit card 10 mounted on the first side 114 of the substrate 110 is positioned so that the portion 138 of its second side 136 is in proximity to the electrical components 118 on the first side 114 of the substrate 110. Similarly, the circuit card 10 mounted on the second side 116 of the substrate 110 is positioned so that the portion 138 of its second side 136 is in proximity to the electrical components 118 on the second side 116 of the substrate 110.

In certain embodiments, the contacts 50 of the flexible connector 30 are soldered to the corresponding contacts 120 of the substrate 110. In certain other embodiments, an anisotropic conductive film (ACF) is used to electrically couple the contacts 50 with the contacts 120. Other embodiments can use other means (e.g., conductive epoxy) to electrically couple the contacts 50 with the contacts 120.

As schematically illustrated by FIGS. 7A and 7B, the flexible connector 30 of certain embodiments is bent by an angle greater than 90 degrees (e.g., by 180 degrees).

The first side 32 of the flexible connector 30 is on an outer curve of the bend, and the second side 34 of the flexible connector 30 is on an inner curve of the bend. As described above and shown schematically in FIG. 1A, in certain embodiments, the tapered portion 62 of each electrical conduit 60 has a width that decreases from the contact 50 to the elongate portion 64 of the electrical conduit 60. In certain such embodiments, the tapered portions 62 advantageously prevent the flexible connector 30 from bending with a radius of curvature smaller than a desired radius, thereby avoiding excessive stress and strain on the flexible connector 30 and on the electrical connection between the contact 50 and the contact 120. In certain such embodiments, the tapered portions 62 thus advantageously reduce the failure rate of the flexible connectors 30. In certain embodiments, the flexible connector 30 is bent with a radius of curvature greater than about 0.8 millimeter.

The memory module 200 of certain embodiments further comprises a heat spreader 210, as schematically illustrated by FIGS. 7A and 7B. The heat spreader 210 comprises a thermally conductive material (e.g., copper, aluminum) and is in thermal contact with some or all of the memory devices 90 on the first side 134 of the rigid portion 20. The heat spreader 210 of certain embodiments is configured to provide a thermal conduit to draw heat from the memory devices 90 in thermal communication therewith, to provide cooling of the memory devices 90. In certain embodiments, a thermally conductive film is placed between the memory devices 90 on the first side 134 of the rigid portion 20 and the heat spreader 210 to advantageously enhance the thermal conductivity between the memory devices 90 and the heat spreader 210. The heat spreader 210 of certain embodiments comprises a plurality of sections which fit together, while in certain other embodiments, the heat spreader 210 is a single unitary piece of material. In certain embodiments, the overall thickness of the memory module 200 including the heat spreader 210 is about 10.55 millimeters.

In certain embodiments, the contacts 50 of the flexible connector 30 and the contacts 120 of the substrate 110 are advantageously configured such that the circuit card 10 can be mounted to either the first side 114 or the second side 116 of the substrate 110. By having circuit cards 10 that are compatible for mounting on either side of the substrate 110, certain such embodiments advantageously avoid the necessity of providing and keeping track of two types of circuit cards 10, one for mounting on each side of the substrate 110.

FIGS. 8A-8C provides an example configuration of the contacts 120 on the first side 114 and the second side 116 of the substrate 110 (corresponding to the contacts 50 on each circuit card 10) and the edge connector contacts 112 of the substrate 110 for a DDR1 registered dual in-line memory module (RDIMM) compatible with certain embodiments described herein. FIGS. 9A-9C provides an example configuration of a DDR2 RDIMM with registers and PLL circuit elements on the circuit card 10 compatible with certain embodiments described herein. FIGS. 10A-10C provides an example configuration of the contacts 120 and the edge connector contacts 112 of a DDR2 RDIMM with registers and PLL circuit elements on the substrate 110 compatible with certain embodiments described herein. In each of the embodiments of FIGS. 8A-8C, 9A-9C, and 10A-10C, the contacts 50 of both circuit cards 10 connected to the contacts 120 on the first side 114 and the second side 116 of the substrate 110 are identical. Therefore, a circuit card 10 of certain such embodiments is advantageously used on either side of the substrate 110.

Figure 11A:
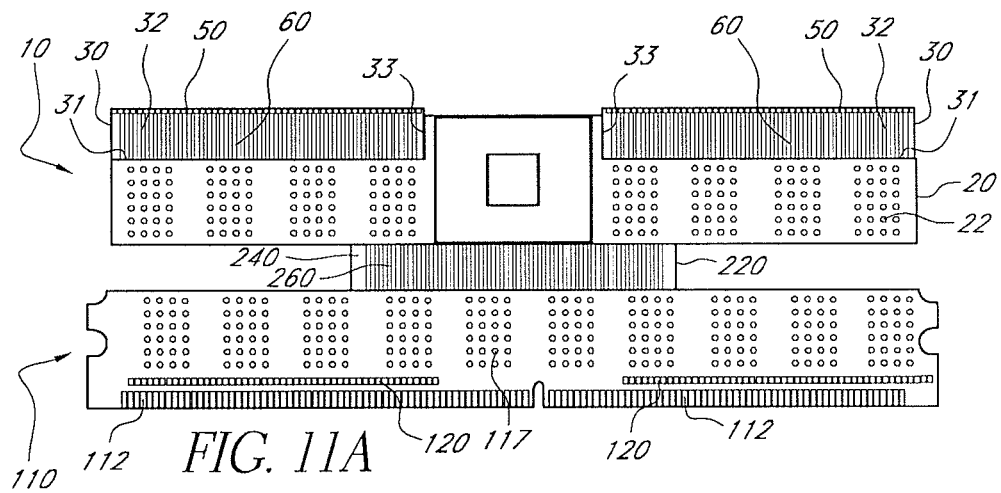
Figure 11B:
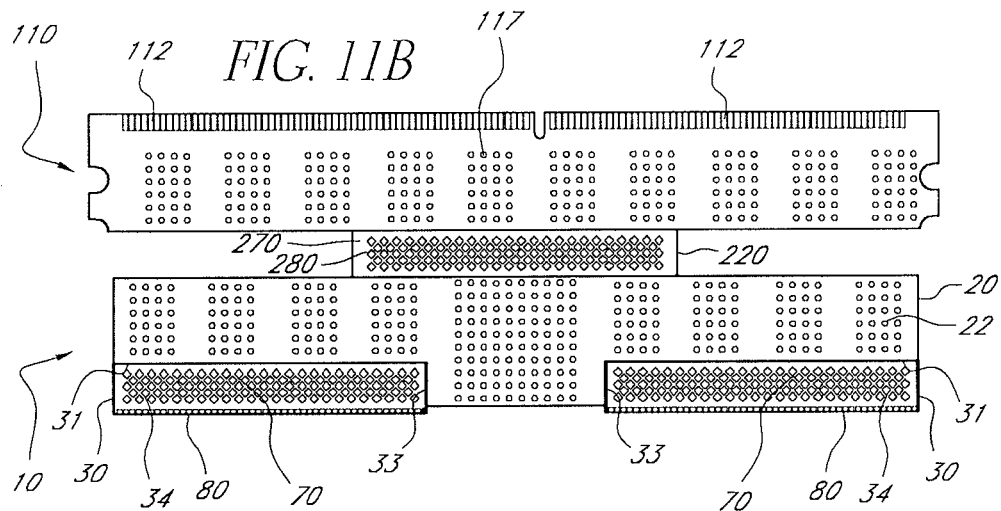
Figure 11C:
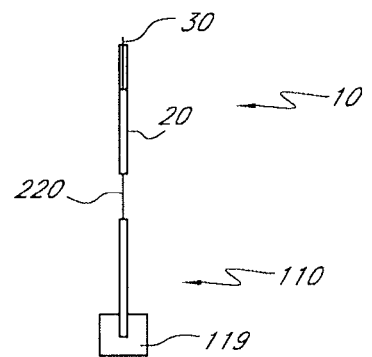

FIGS. 11A-11C schematically illustrate three views of another example circuit card 10 compatible with certain embodiments described herein with example dimensions (in millimeters). The circuit card 10 comprises a rigid portion 20 with a plurality of contacts 22 configured to be in electrical communication with a plurality of electrical components (e.g., memory devices 90). The circuit card 10 further comprises a plurality of flexible connectors 30, each of which is coupled to the rigid portion 20. One or more of the flexible connectors 30 has a first side 32 and a second side 34, and comprises a dielectric layer 40, a second plurality of contacts 50 configured to be in electrical communication with a substrate 110, a plurality of electrical conduits 60 on the first side 32 of the flexible connector 30, and an electrically conductive layer 70 on the second side 34 of the flexible connector 30.

One or more of the flexible connectors 30 are compatible with the flexible connector 30 schematically illustrated by FIGS. 1A-1C, 2, and 3. The electrical conduits 60 of the flexible connector 30 extend from the rigid portion 20 to the second plurality of contacts 50 of the flexible connector 30. The electrical conduits 60 of the flexible connector 30 are in electrical communication with one or more contacts 22 of the rigid portion 20 and one or more contacts 50 of the flexible connector 30. The electrically conductive layer 70 is superposed with the plurality of electrical conduits 60 with the dielectric layer 40 therebetween. The electrically conductive layer 70 does not cover one or more portions 80 of the second side 34 of the flexible connector 30, thereby providing improved flexibility of the flexible connector 30.

In certain embodiments, as schematically illustrated by FIGS. 11A-11C, the flexible connector 30 is coupled to the rigid portion 20 along a first edge 31 of the flexible connector 30 and is not coupled to the rigid portion 20 along a second edge 33 of the flexible connector 30. The flexible connector 30 of certain such embodiments is free to bend in a direction generally perpendicular to the flexible connector 30.

In certain embodiments, the substrate 110 comprises a plurality of edge connector contacts 112, a plurality of component contacts 117, and a plurality of surface contacts 120. The edge connector contacts 112 of certain embodiments are configured to be releasably mounted to corresponding contacts of a computer system socket 119. The component contacts 117 of certain embodiments are configured to be electrically coupled to a plurality of electrical components 118 (e.g., memory devices 90). The surface contacts 120 of certain embodiments are configured to be electrically coupled to the second plurality of contacts 50 of the circuit card 10.

In certain embodiments, as schematically illustrated by FIGS. 11A-11C, the circuit card 10 and the substrate 110 are coupled together by one or more flexible circuits 220. The flexible circuit 220 of certain embodiments comprises a dielectric layer 240, a plurality of electrical conduits 260 on a first side of the flexible circuit 220, and an electrically conductive layer 270 on a second side of the flexible circuit 220. In certain such embodiments, the electrically conductive layer 270 is superposed with the plurality of electrical conduits 260 with the dielectric layer 240 therebetween. The electrically conductive layer 270 of certain embodiments does not cover one or more portions 280 of the second side of the flexible circuit 220, thereby providing improved flexibility of the flexible circuit 220. The flexible circuit 220 of certain embodiments includes one or more of the various features described above with regard to the flexible connector 30, including but not limited to tapered portions of the conduits 260, the cross-hatched metal lines of the electrically conductive layer 270, and the metal traces of the electrically conductive layer 270.

Figure 12A:
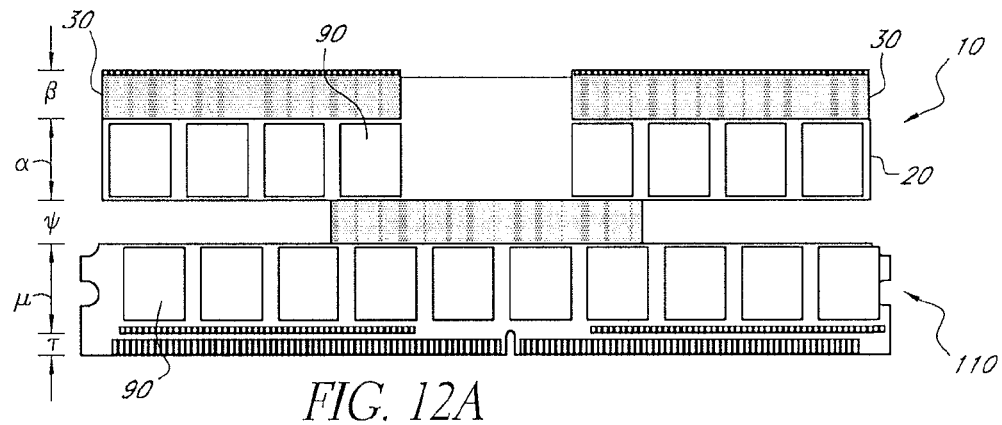
FIGS. 12A-12C schematically illustrate three views of the circuit card and the substrate of FIGS. 11A-11C populated by a plurality of memory devices and an advanced memory buffer (AMB) mounted on the circuit card and on the substrate.
Figure 12B:
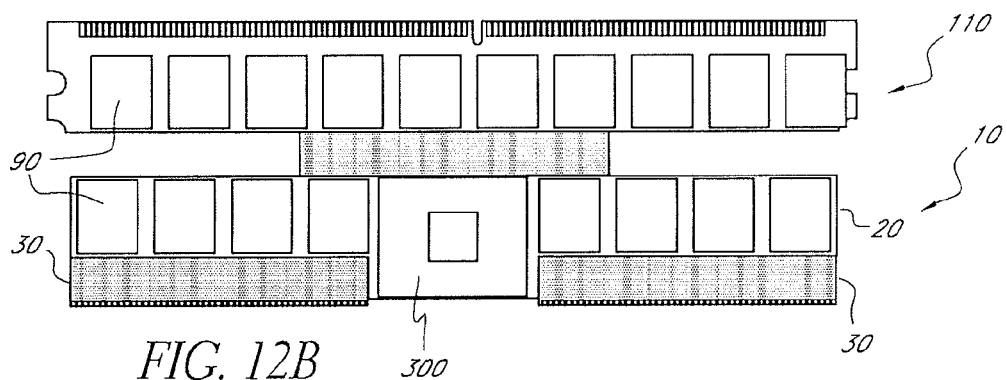
Figure 12C:
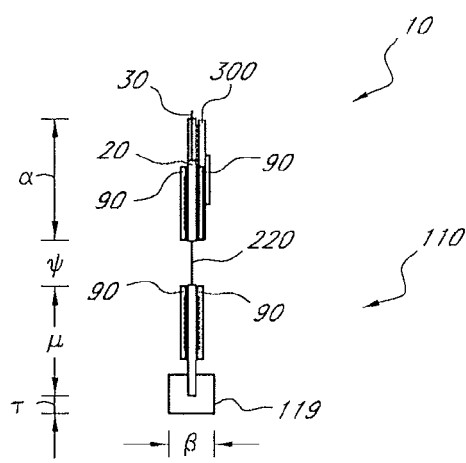

FIGS. 12A-12C schematically illustrate three views of the circuit card 10 and the substrate 110 of FIGS. 11A-11C populated by a plurality of memory devices 90 and an advanced memory buffer (AMB) 300 mounted on the circuit card 10 and on the substrate 110. The circuit card 10 and the substrate 110 schematically illustrated by FIGS. 12A-12C are configured to be used in an FBDIMM. In addition, FIGS. 12A and 12C provide some example dimensions (in millimeters) of the populated circuit card 10 and substrate 110 in accordance with certain embodiments described herein. Other dimensions are also compatible with various embodiments described herein.

As schematically illustrated by FIGS. 12A-12C, the circuit card 10 of certain embodiments is populated by 16 memory devices 90 (e.g., DDR2 DRAM devices and one AMB 300 mounted thereon. In certain embodiments, the AMB 300 has dimensions of about 24.5 millimeters by 19.5 millimeters by 2.4 millimeters. Example AMBs compatible with certain embodiments described herein are available from Intel Corp. of Santa Clara, Calif., Integrated Device Technology, Inc of San Jose, Calif., and NEC Electronics America of Santa Clara, Calif. In addition, the circuit card 10 can also comprise other electrical components including, but not limited to passive electrical components (e.g., resistors, capacitors). The substrate 110 of certain embodiments is populated by 20 memory devices 90 mounted thereon, which are substantially identical or similar to those mounted on the circuit card 10.

Figure 13A:
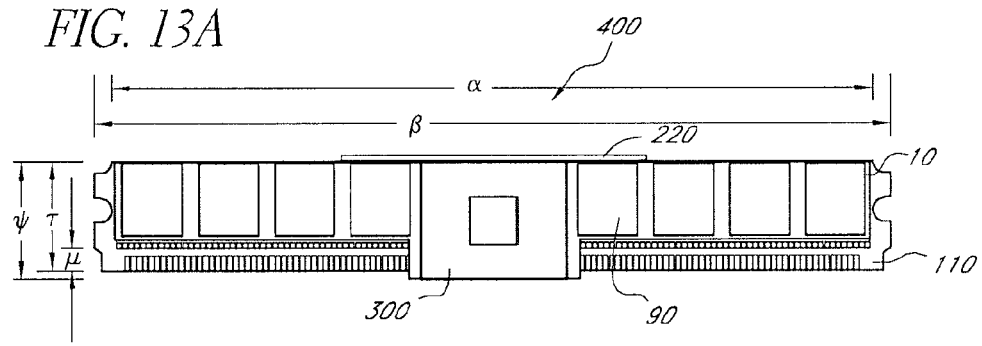
FIGS. 13A-13D schematically illustrate four views of an example memory module comprising the circuit card and the substrate in accordance with certain embodiments described herein.
Figure 13B:
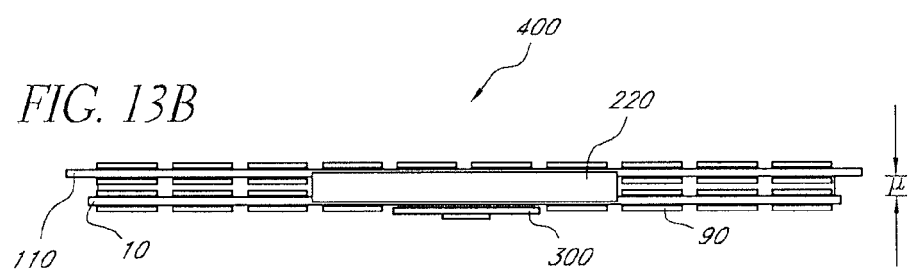
Figure 13C:
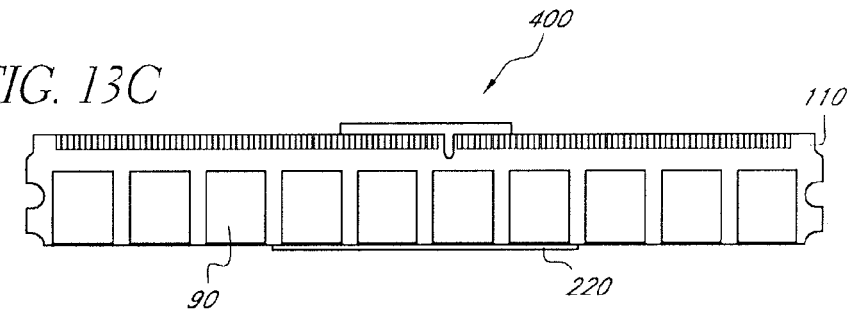
Figure 13D:
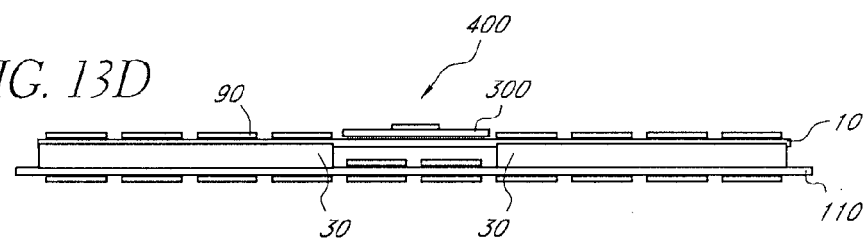

FIGS. 13A-13D schematically illustrate four views of a memory module 400 comprising the circuit card 10 and the substrate 110 in accordance with certain embodiments described herein. FIG. 13A schematically illustrates a view of the side of the memory module 400 having the AMB 300, and FIG. 13C schematically illustrates a view of the side of the memory module 400 opposite to the side of FIG. 13A. FIG. 13B schematically illustrates a top view of the memory module 400, and FIG. 13D schematically illustrates a bottom view. FIGS. 13A and 13B provide some example dimensions (in millimeters) of the memory module 400, but other dimensions are also compatible with various embodiments described herein. The memory module 400 is formed by bending the flexible circuit 220 to fold the circuit card 10 towards the substrate 110, and by electrically coupling (e.g., soldering) the contacts 50 of the circuit card 10 to the corresponding contacts 120 of the substrate 110. Exemplary memory modules compatible with certain embodiments described herein include, but are not limited to, dual in-line memory modules (DIMMs) such as fully-buffered DIMMs (FBDIMMs).

Figure 14A:
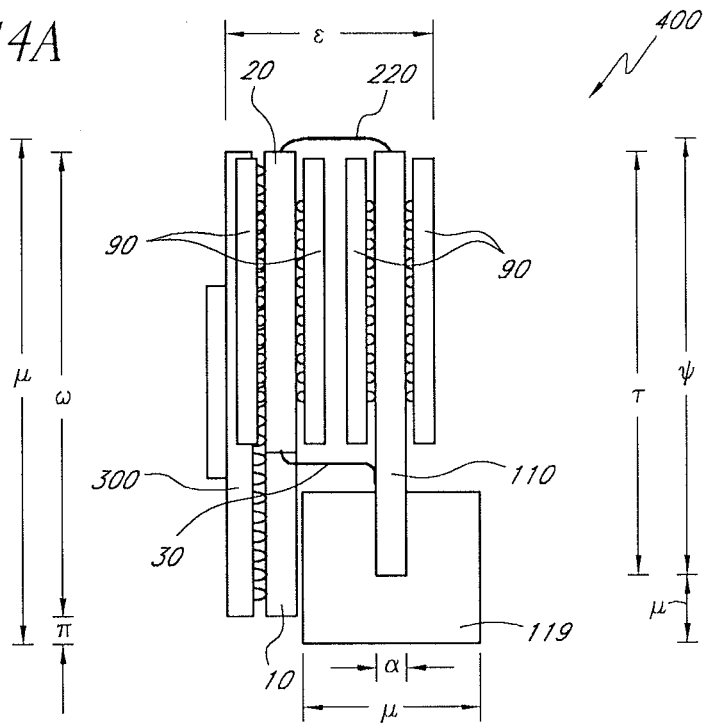
FIG. 14A schematically illustrates an edge view of the memory module of FIGS. 13A-13D mounted in a computer system socket.
Figure 14B:
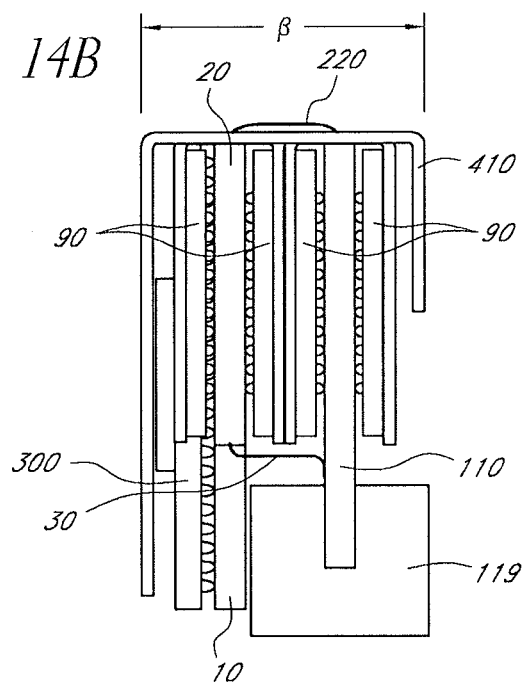
FIG. 14B schematically illustrates an edge view of the memory module of FIGS. 13A-13D with a heat spreader mounted thereon.

FIG. 14A schematically illustrates an edge view of the memory module 400 mounted in a computer system socket 119 with some example dimensions (in millimeters). FIG. 14B schematically illustrates an edge view of the memory module 400 with a heat spreader 410 mounted thereon. The heat spreader 410 comprises a thermally conductive material (e.g., copper, aluminum) and is in thermal contact with the memory modules 90 mounted on the circuit card 10 and on the substrate 110, and is in thermal contact with the AMB 300. In certain embodiments, a thermally conductive film is placed between the memory devices 90 and the heat spreader 410 and between the AMB 300 and the heat spreader 410 to advantageously enhance the thermal conductivity between the memory devices 90 and the heat spreader 410 and between the AMB 300 and the heat spreader 410. The heat spreader 410 of certain embodiments comprises a plurality of sections which fit together, while in certain other embodiments, the heat spreader 410 is a single unitary piece of material.

Figure 15:
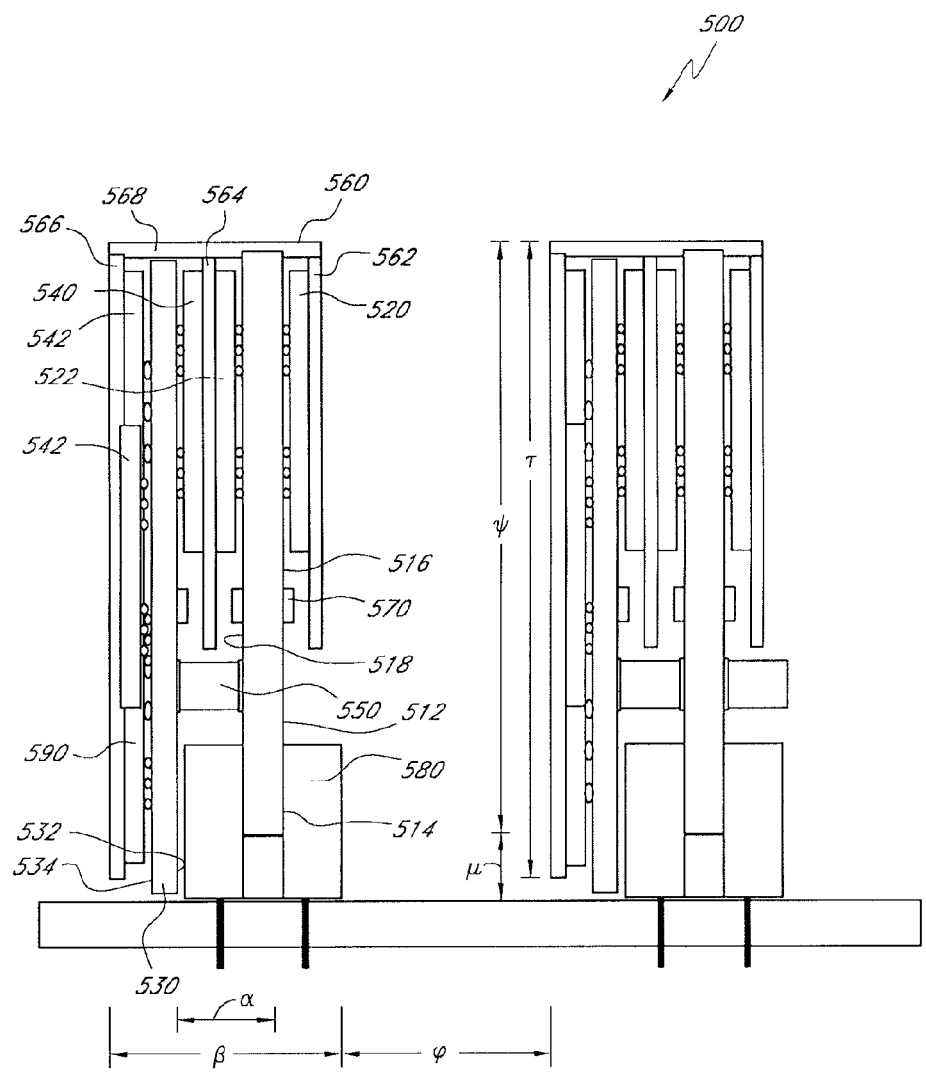
FIG. 15 has the following example dimensions: α=4 millimeters; β=9.4 millimeters; ψ=18.3 millimeters; μ=2.87 millimeters; τ=20 millimeters; and φ=5.8 millimeters.

FIG. 15 schematically illustrates a pair of example modules 500 each having a single daughter PCB in accordance with certain embodiments described herein with example dimensions (in millimeters). While the module 500 of FIG. 15 is shown in a vertical configuration, persons skilled in the art using the present disclosure are able to utilize other orientations of the module 500. The module 500 schematically illustrated by FIG. 15 comprises a mother PCB 512 having an edge connector 514, a first side 516, and a second side 518. The module 500 further comprises a first plurality of electrical components 520 mounted on the first side 516 of the mother PCB 512 and a second plurality of electrical components 522 mounted on the second side 518 of the mother PCB 512. The first plurality of electrical components 520 are electrically coupled to the edge connector 514 and the second plurality of electrical components 522 are electrically coupled to the edge connector 514. The module 510 further comprises at least one daughter PCB 530 having a first side 532 facing towards the mother PCB 512 and a second side 534 facing away from the mother PCB 512. The module 500 further comprises a third plurality of electrical components 540 mounted on the first side 532 of the daughter PCB 530 and a fourth plurality of electrical components 542 mounted on the second side 534 of the daughter PCB 530. The module 500 further comprises at least one spacer 550 between the mother PCB 512 and the daughter PCB 530. The spacer 550 electrically couples the third plurality of electrical components 540 to the edge connector 514, and electrically couples the fourth plurality of electrical components 542 to the edge connector 514. The module 500 further comprises a heat spreader 560 comprising a thermally conductive material (e.g., copper, aluminum). The heat spreader 560 has a first portion 562 thermally coupled to the first plurality of electrical components 520, a second portion 564 thermally coupled to the second plurality of electrical components 522 and to the third plurality of electrical components 540, and a third portion 566 thermally coupled to the fourth plurality of electrical components 542.

In certain embodiments, the module 500 is a memory module. Example memory modules compatible with certain embodiments described herein include, but are not limited to, DIMMs such as fully-buffered dual in-line memory modules (FBDIMMs). In certain embodiments, the first plurality of electrical components 520, the second plurality of electrical components 522, the third plurality of electrical components 540, and the fourth plurality of electrical components 542 each comprise memory components. Example memory components compatible with certain embodiments described herein include, but are not limited to DDR2 dynamic random-access memory (DRAM) components in dual-die packages (DDP) with ball-grid array (BGA) connections, and with exemplary memory capacities such as 1 Gb (256M×4-bit) or 512 Mb (128M×4-bit).

In certain embodiments, the mother PCB 512 comprises a laminate material (e.g., FR4) comprising fiberglass saturated with epoxy resin and further comprises electrically conductive (e.g., copper) traces and vias to which the first plurality of electrical components 520 and the second plurality of electrical components 522 are electrically coupled. These traces and vias provide electrical conductivity between the edge connector 514 and the first plurality of electrical components 520 and between the edge connector 514 and the second plurality of electrical components 522. In certain embodiments, the mother PCB 512 further comprises passive electrical components 570 (e.g., resistors, capacitors) which are mounted on the mother PCB 512 and are electrically coupled to the first plurality of electrical components 520 and the second plurality of electrical components 522. In certain such embodiments, at least some of these passive electrical components 570 are mounted on at least one of the first side 516 and the second side 518 of the mother PCB 512, while in certain other such embodiments, at least some of these passive electrical components 570 are within the mother PCB 512 (e.g., embedded between laminate layers).

In certain embodiments, the mother PCB 512 has dimensions which are selected to be compatible with installation of the module 500 in the computer system. For example, in certain embodiments, the mother PCB 512 has a height of 18.3 millimeters.

Figure 16:
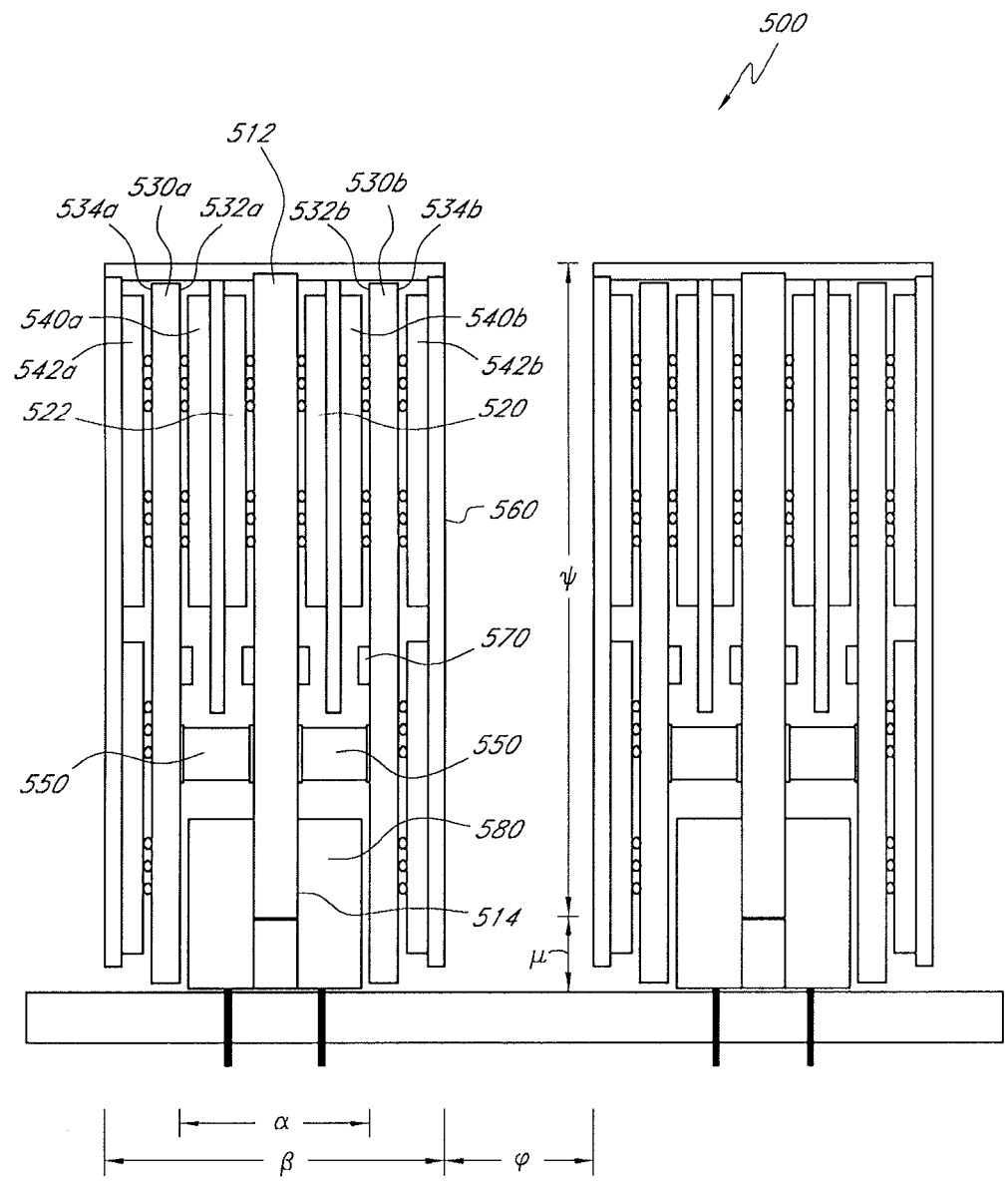
FIG. 16 schematically illustrates another pair of example modules each having a mother PCB and two daughter PCBs in accordance with certain embodiments described herein FIG. 16 has the following example dimensions: α=8 millimeters; β=13.5 millimeters, ψ=18.3 millimeters, μ=2.87 millimeters, and φ=2 millimeters.

The edge connector 514 of the mother PCB 512 is configured to be releasably mounted to a corresponding socket 580 of the computer system, as schematically illustrated by FIGS. 15 and 16. In certain embodiments, the first plurality of electrical components 520 comprise memory components which are mounted on the first side 516 of the mother PCB 512 in a first row, and the second plurality of electrical components 522 comprise memory components which are mounted on the second side 518 of the mother PCB 512 in a second row. In certain such embodiments, each of the first row and the second row of the mother PCB 512 comprises eight or nine memory components.

In certain embodiments, the at least one daughter PCB 530 comprises a laminate material (e.g., FR4) comprising fiberglass saturated with epoxy resin and further comprises electrically conductive (e.g., copper) traces and vias to which the third plurality of electrical components 540 and the fourth plurality of electrical components 542 are electrically coupled. These traces and vias provide electrical conductivity between the spacer 550 and the third plurality of electrical components 540 and between the spacer 550 and the fourth plurality of electrical components 542. In certain embodiments, the daughter PCB 530 further comprises passive electrical components 570 (e.g., resistors, capacitors) which are mounted on the daughter PCB 530. In certain such embodiments, at least some of these passive electrical components 570 are mounted on at least one of the first side 532 and the second side 534 of the daughter PCB 530, while in certain other such embodiments, at least some of these passive electrical components 570 are within the daughter PCB 530 (e.g., embedded between laminate layers).

In certain embodiments, the daughter PCB 530 has dimensions which are selected to be compatible with installation of the module 510 in the computer system. For example, in certain embodiments, the daughter PCB 530 has a height of 20 millimeters. As schematically illustrated in FIGS. 15 and 16, in certain embodiments, the daughter PCB 530 extends along the side of the socket 580. The thickness of the socket 580 in certain such embodiments provides a limit to a minimum distance between the mother PCB 512 and the daughter PCB 530, as well as a minimum total thickness of the module 510. As can be seen in FIGS. 15 and 16, smaller thicknesses of the socket 580 correspond to smaller minimum thicknesses of the module 500. In certain embodiments, the height of the socket 580 provides a limit to a maximum height of the daughter PCB 530, as well as a maximum height of the module 500. As can be seen in FIGS. 15 and 16, smaller heights of the socket 580 correspond to smaller heights of the module 500.

In certain embodiments, the third plurality of electrical components 540 comprise memory components which are mounted on the first side 532 of the daughter PCB 530 in a first row, and the fourth plurality of electrical components 542 comprise memory components which are mounted on the second side 534 of the daughter PCB 530 in a second row. In certain such embodiments, each of the first row and the second row of the daughter PCB 530 comprises eight or nine memory components.

In certain embodiments, the memory components of the first and second rows of the mother PCB 512 and the first and second rows of the daughter PCB 530 form four ranks of memory components. For example, for the module 500 schematically illustrated by FIG. 15, 36 memory components (e.g., DDR2 256M×4-bit, 1 G DDP DRAM components) can be used to form a two-rank memory module (e.g., a two-rank FBDIMM). Example ranks compatible with embodiments described herein are blocks of memory of a fixed depth and having either an "×64-bit" or an "×72-bit" width. For example, 16 or 18 "×4" memory components can be used to form a rank of memory, while 8 or 9 "×8" memory components can be used to form a rank of memory.

In certain embodiments (e.g., in which the module 500 is an FBDIMM), the fourth plurality of electrical components 542 comprises an advanced memory buffer 590 (AMB), as schematically illustrated in FIG. 15. In certain embodiments, the AMB 590 has dimensions of approximately 24.5 millimeters by 19.5 millimeters by 2.4 millimeters. Example AMBs compatible with certain embodiments described herein are available from Intel Corp. of Santa Clara, Calif., Integrated Device Technology, Inc of San Jose, Calif., and NEC Electronics America of Santa Clara, Calif. In certain embodiments, as schematically illustrated by FIG. 15, the larger height of the daughter PCB 530, as compared to the height of the mother PCB 512 advantageously provides space in which to mount the AMB 590. In certain embodiments, an FBDIMM can be implemented within a very low profile (VLP) form factor.

FIG. 16 schematically illustrates another pair of example modules 500 each having two daughter PCBs in accordance with certain embodiments described herein with example dimensions (in millimeters). While the module 500 of FIG. 16 is shown in a vertical configuration, persons skilled in the art using the present disclosure are able to utilize other orientations of the module 500. In certain embodiments (e.g., in which the module 500 is a four-rank DIMM), the module 500 of FIG. 16 comprises a first daughter PCB 530a and a second daughter PCB 530b. The third plurality of electrical components 540a comprises memory components mounted on the first side 532a of the first daughter PCB 530a facing the mother PCB 512, and the fourth plurality of electrical components 542a comprises memory components mounted on the second side 534a of the first daughter PCB 530a. The module 500 further comprises a fifth plurality of electrical components 540b comprising memory components mounted on the first side 532b of the second daughter PCB 530b facing the mother PCB 512, and a sixth plurality of electrical components 542b comprising memory components mounted on the second side 534b of the second daughter PCB 542b.

In certain embodiments, the memory components of the third plurality of electrical components 540a are mounted in a row and the memory components of the fourth plurality of electrical components 542a are mounted in two rows. For example, as schematically illustrated in FIG. 16, one row of memory components can be mounted on an upper portion (e.g., upper half) of the first side 532a of the first daughter PCB 530a and another row of memory components can be mounted on a lower portion (e.g., lower half) of the second side 534b of the first daughter PCB 530a. Similarly, in certain embodiments as schematically illustrated in FIG. 16, the memory components of the fifth plurality of electrical components 540b are mounted in a row and the memory components of the sixth plurality of memory components 542b are mounted in two rows. In certain such embodiments, each row of the first daughter PCB 530a and the second daughter PCB 530b comprises eight or nine memory components.

In certain embodiments the memory components of the mother PCB 512 and of the two daughter PCBs 530a, 530b form four ranks of memory components. For example, for the module 500 schematically illustrated by FIG. 16, 72 memory components (e.g., DDR400 128M×4-bit, 512 Mb DRAM components) can be used to form a four-rank memory module (e.g., a four-rank DIMM with 4 GB×4 memory capacity).

In certain embodiments, as schematically illustrated by FIG. 16, the larger height of the daughter PCBs 530a, 530b as compared to the height of the mother PCB 512, advantageously provides space in which to mount additional memory components. In certain embodiments, a four-rank memory module can be implemented within a very low profile (VLP) form factor.

Besides providing an electrical conduit between the daughter PCB 530 and the mother PCB 512, in certain embodiments, the spacer 550 between the mother PCB 512 and the daughter PCB 530 provides mechanical stability to the module 500 by supporting the daughter PCB 530 on the mother PCB 512. In certain such embodiments, the spacer 550 comprises one or more pins which are mechanically mounted to the mother PCB 512 and to the daughter PCB 530. In certain embodiments, the spacer 550 comprises a flexible electrical conduit between the mother PCB 512 and the daughter PCB 530. Examples of flexible electrical conduits compatible with certain embodiments described herein include, but are not limited to, flex circuits and wire jumpers. In certain embodiments compatible with the exemplary module 500 of FIG. 16, the spacer 550 provides an electrical conduit for chip-select signals to complete a rank of memory using one row of memory modules from the first daughter PCB 530*a* and one row of memory modules from the second daughter PCB 530*b*.

The heat spreader 560 of certain embodiments is configured to remove heat away from the electrical components of the module 500. In certain embodiments, the heat spreader 560 comprises a plurality of separable sections that are held in place on at least one of the mother PCB 512 and the at least one daughter PCB 530 by a clip. In certain other embodiments, the heat spreader 560 is held in place by being mechanically coupled to the electrical components to which the heat spreader 560 is thermally coupled. In certain other embodiments, the heat spreader 560 is thermally coupled (e.g., by contacting or by soldering) to one or more traces or vias of the mother PCB 512, thereby providing a conduit for heat from the heat spreader 560, through the edge connector 514, to other portions of the computer system.

In certain embodiments, as schematically illustrated by FIG. 15, the first portion 562 of the heat spreader 560 covers and is thermally coupled to the first plurality of electrical components 520. The second portion 564 of the heat spreader 560 is sandwiched between, and is thermally coupled to, the second plurality of electrical components 522 and the third plurality of electrical components 540. The third portion 566 of the heat spreader 560 covers and is thermally coupled to the fourth plurality of electrical components 542. In certain embodiments, as schematically illustrated by FIG. 15, the heat spreader 560 further comprises a fourth portion 568 which is generally perpendicular to the first portion 562, the second portion 564, and the third portion 566, and which provides mechanical stability to the heat spreader 560 as well as additional thermal capacity to diffuse heat away from the electrical components.

In certain embodiments, the module 500 advantageously uses the limited space between sockets 580 of the computer system to provide a high-density memory module with capability to dissipate heat away from the electrical components of the module 500. For example, as schematically illustrated by FIG. 15, the spacing of the sockets 580 is approximately 15.2 millimeters, each of the first portion 562, the second portion 564, and the third portion 566 of the heat spreader 560 has a thickness of approximately 0.5 millimeters, the AMB 590 has a thickness of approximately 2 millimeters, the daughter PCB 530 has a thickness of approximately 1 millimeter, the memory modules each have a thickness of approximately 1.2 millimeters, and the mother PCB 512 has a thickness of approximately 1.3 millimeters. Thus, in certain embodiments, the module 500 has a total thickness of approximately 9.4 millimeters and there is a gap of approximately 5.8 millimeters between the two modules 500. Similarly, each of the example modules 500 of FIG. 16 has a total thickness of approximately 13.5 millimeters, with a gap of approximately 2 millimeters between the two modules 500. By using a thinner material for the mother PCB 512, the daughter PCB 530, or the heat spreader 560, certain embodiments can decrease the total thickness of the module 500.

Certain embodiments of the module 500 advantageously reduce the cost of ventilation. Certain embodiments of the module 500 advantageously allow proper operation of the electrical components (e.g., ICs) of the module 500 by maintaining temperatures within the desired operation range.

Certain embodiments described herein are useful in various computer systems, examples of which include but are not limited to network servers, workstations, personal computers, mainframe computers and the like. The computer system will typically include one or more input devices, such as a mouse, trackball, touchpad, and/or keyboard, a display, and computer-readable memory media, such as random-access memory (RAM) integrated circuits and a hard-disk drive. It will be appreciated that one or more portions of the computer system, including some or all of the software code, may be remote from the user and, for example, resident on a network resource, such as a LAN server, Internet server, network storage device, etc.

Various specific embodiments have been described above. Although the present invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. An electronic module for a computer system, comprising:
    a first circuit board having a plurality of edge connectors configured to releasably connect to electrical contacts of a computer system socket;
    a second circuit board having a plurality of contacts configured to connect with a plurality of electrical components; and
    a flexible connector having electrical conduits formed over a dielectric layer to provide electrical connection between at least some of the plurality of edge connectors and at least some of the plurality of contacts.

2. The electronic module of claim 1, wherein the flexible connector further includes an electrically conductive layer extending across a region of the dielectric layer, the electrically conductive layer being superposed with the electrical conduits and separated from the electrical conduits by the dielectric layer.

3. The electronic module of claim 1, wherein the second circuit board has a first side and an opposing second side, wherein the plurality of contacts include a first plurality of contacts on the first side and a second plurality of contacts on the second side, and wherein the flexible connector provides electrical connections between at least some of the edge connectors and at least some of the first plurality of contacts and between at least some of edge connectors and at least some of the second plurality of contacts.

4. The electronic module of claim 1, wherein the second circuit board further comprises edge contacts along an edge of the second circuit board and wherein the first circuit board further comprises surface contacts on at least a first side of the circuit board, the surface contacts on the first side of the circuit board are configured to be coupled to respective ones of the edge contacts of the second circuit board.

5. The electronic module of claim 4, wherein a majority of the surface contacts are coupled to respective ones of a majority of the edge connectors.

6. The electronic module of claim 1, wherein the flexible connector is bent by more than 90 degrees.

7. The electronic module of claim 6, wherein the flexible connector is bent by nearly 180 degrees.

8. A flexible connector, comprising:
a dielectric layer having opposing first side and second side, and opposing first edge and second edge;
a first conductive layer on the first side of the dielectric layer and including a plurality of electric conduits for carrying electric signals, the electric conduits extending generally in a direction from one of the first edge and the second edge to the other one of the first edge and the second edge; and
a second conductive layer on the second side of the dielectric layer for serving as one of a power plane and a ground plane.

9. The flexible connector of claim 8, wherein the second conductive layer exposes portions of the dielectric layer for increased flexibility of the flexible connector.

10. The flexible connector of claim 9, wherein the second conductive layer has a crosshatched pattern that defines the exposed portions of the dielectric layer.

11. The flexible connector of claim 9, wherein the second conductive layer includes electrically interconnected metal traces.

12. The flexible connector of claim 11, wherein the metal traces are substantial wider than the electrical conduits.

13. The flexible connector of claim 8, wherein each of the electric conduits includes an elongated portion and a tapered portion, the tapered portion preventing the flexible connector from bending excessively.

14. The flexible connector of claim 8, wherein at least one of the electric conduits has one or more branching points at which at least one of the electric conduits branches or forks in two or more separate directions.

15. The flexible connector of claim 8, wherein at least one of the electric conduits has a curve of non-zero angle as it extends across the first side of the dielectric layer.

16. The flexible connector of claim 8, further comprising contacts associated with respective electrical conduits, the contacts being disposed near one of the second edge of the flexible connector.

17. The flexible connector of claim 16, wherein each contact comprises an electrically conductive first region on the first side of the dielectric and an electrically conductive second region on the second side of the dielectric.

18. The flexible connector of claim 17, wherein the each contact further comprises a hole through the dielectric layer, the hole having an inner surface coated with an electrically conductive material and electrically coupling the first region and the second region.

19. The flexible connector of claim 8, wherein the flexible connector is configured to provide electrical and physical connections between two circuit boards.

20. The flexible connector of claim 8, wherein the flexible connector is capable of being bent by an angle of 180 degrees.

* * * * *